US011621322B2

(12) United States Patent
Zhao et al.

(10) Patent No.: US 11,621,322 B2
(45) Date of Patent: Apr. 4, 2023

(54) DIE-TO-DIE ISOLATION STRUCTURES FOR PACKAGED TRANSISTOR DEVICES

(71) Applicant: Wolfspeed, Inc., Durham, NC (US)

(72) Inventors: Lei Zhao, Chandler, AZ (US); Fabian Radulescu, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 16/944,002

(22) Filed: Jul. 30, 2020

(65) Prior Publication Data
US 2022/0037464 A1 Feb. 3, 2022

(51) Int. Cl.
*H01L 29/06* (2006.01)
*H01L 23/66* (2006.01)
*H01L 29/78* (2006.01)
*H01L 29/778* (2006.01)

(52) U.S. Cl.
CPC .......... *H01L 29/0642* (2013.01); *H01L 23/66* (2013.01); *H01L 29/7786* (2013.01); *H01L 29/7817* (2013.01); *H01L 2223/6611* (2013.01); *H01L 2223/6655* (2013.01); *H01L 2223/6672* (2013.01)

(58) Field of Classification Search
CPC . H01L 29/0642; H01L 23/66; H01L 29/7786; H01L 29/7817; H01L 2223/6611; H01L 2223/6655; H01L 2223/6672; H01L 29/2003; H01L 29/402; H01L 29/4175; H01L 29/41758
USPC ....................................................... 257/728
See application file for complete search history.

(56) References Cited

U.S. PATENT DOCUMENTS

| | | | |
|---|---|---|---|
| 9,979,361 B1* | 5/2018 | Mangaonkar | H03F 3/213 |
| 2006/0264024 A1* | 11/2006 | Brennan | H01L 24/49 |
| | | | 438/617 |
| 2008/0246547 A1* | 10/2008 | Blednov | H03F 3/195 |
| | | | 29/601 |
| 2014/0027906 A1* | 1/2014 | Narita | H01L 24/48 |
| | | | 257/784 |
| 2014/0070365 A1* | 3/2014 | Viswanathan | H01L 23/66 |
| | | | 257/532 |
| 2015/0243649 A1* | 8/2015 | Brech | H01L 23/528 |
| | | | 257/296 |
| 2016/0087588 A1* | 3/2016 | Szymanowski | H01L 23/66 |
| | | | 330/307 |
| 2016/0126349 A1* | 5/2016 | Edwards | H01L 23/4824 |
| | | | 257/341 |
| 2016/0351513 A1* | 12/2016 | Zhu | H03F 3/195 |
| 2017/0117239 A1* | 4/2017 | Lembeye | H03F 1/565 |
| 2017/0309714 A1* | 10/2017 | Xie | H01L 29/41766 |
| 2017/0366148 A1* | 12/2017 | Jang | H03F 3/193 |
| 2017/0373645 A1* | 12/2017 | Jang | H03F 3/604 |
| 2018/0350937 A1* | 12/2018 | Hung | H01L 29/66545 |
| 2019/0044483 A1* | 2/2019 | Arigong | H03F 1/565 |

(Continued)

*Primary Examiner* — Sheikh Maruf
(74) *Attorney, Agent, or Firm* — Myers Bigel, P.A.

(57) ABSTRACT

A transistor amplifier package includes a base, one or more transistor dies on the base, first and second leads coupled to the one or more transistor dies and defining respective radio frequency (RF) signal paths, and an isolation structure on the base between the respective RF signal paths. The isolation structure includes first and second wire bonds. The first and second wire bonds may have a crossed configuration defining at least one cross point therebetween. Related wire bond-based isolation structures are also discussed.

36 Claims, 19 Drawing Sheets

(56) References Cited

U.S. PATENT DOCUMENTS

| | | | |
|---|---|---|---|
| 2019/0131429 A1* | 5/2019 | Shu | H01L 21/823481 |
| 2019/0181106 A1* | 6/2019 | Heeres | H03F 3/195 |
| 2019/0229077 A1* | 7/2019 | De Boet | H01L 24/49 |
| 2019/0341893 A1* | 11/2019 | Jang | H03F 1/0288 |
| 2020/0051866 A1* | 2/2020 | Ok | H01L 21/76895 |
| 2020/0176402 A1* | 6/2020 | Trang | H01L 21/565 |
| 2020/0194581 A1* | 6/2020 | Kan | H01L 29/0696 |
| 2021/0202553 A1* | 7/2021 | Mun | H01L 27/1463 |

\* cited by examiner

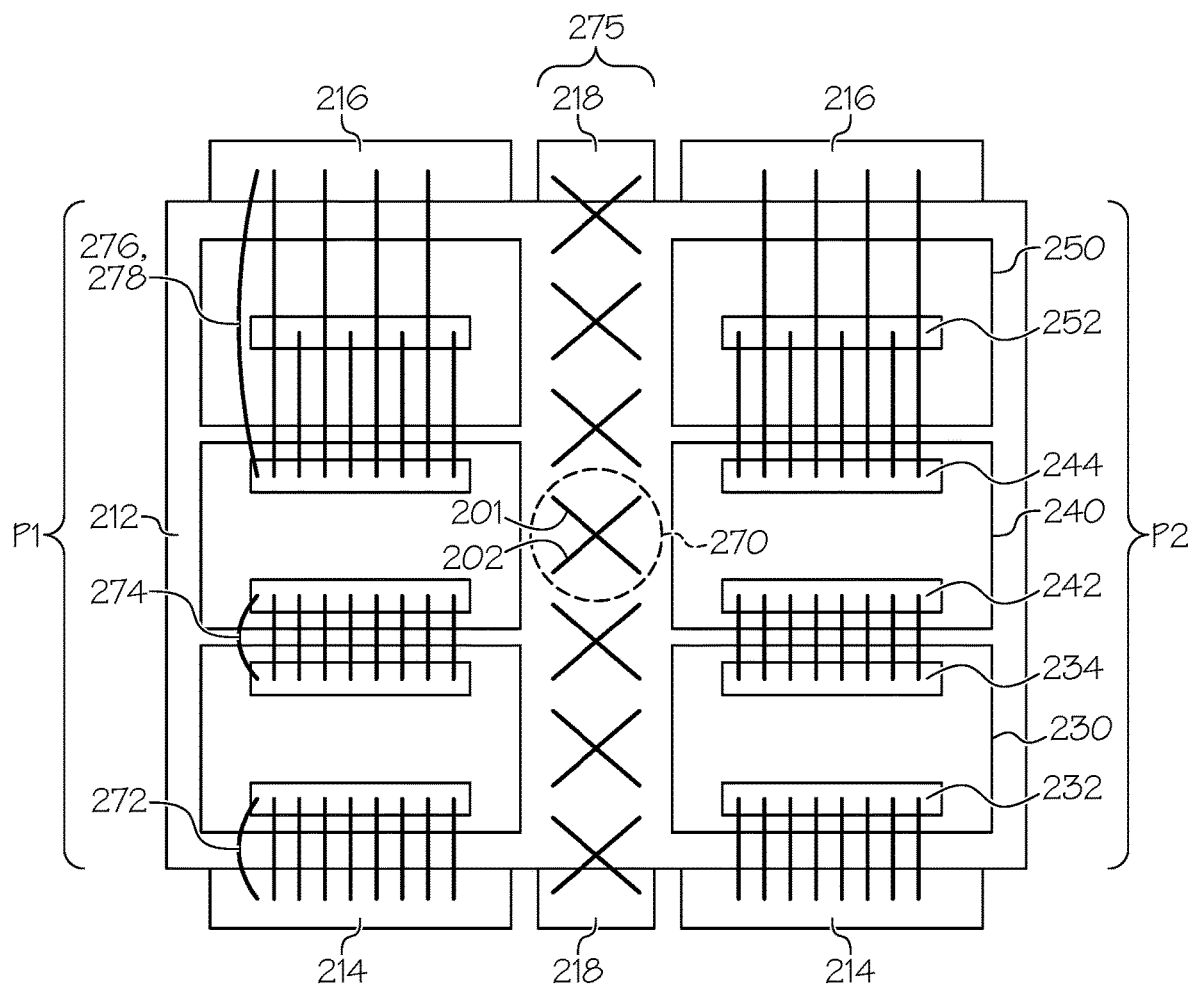
FIG. 2A
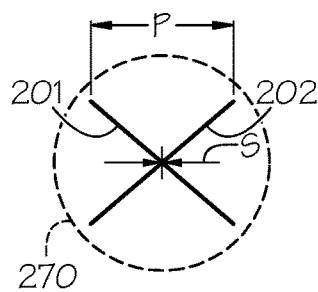
FIG. 2A1
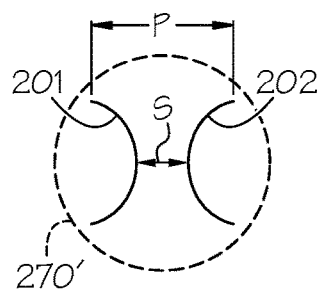
FIG. 2A2
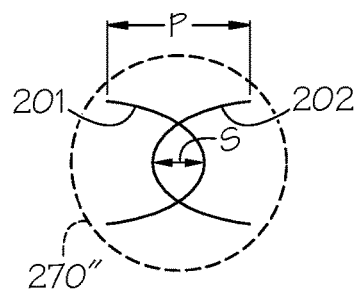
FIG. 2A3

DIE-TO-DIE ISOLATION STRUCTURES FOR PACKAGED TRANSISTOR DEVICES

FIELD

This invention relates generally to radio frequency ("RF") transistors and, more particularly, to isolation in packaged RF transistors.

BACKGROUND

Electrical circuits requiring high power handling capability while operating at high frequencies, such as R-band (0.5-1 GHz), S-band (3 GHz) and X-band (10 GHz), have in recent years become more prevalent. In particular, there may be high demand for radio frequency (RF) transistor amplifiers that are used to amplify RF signals at radio (including microwave) frequencies. These RF transistor amplifiers may need to exhibit high reliability, good linearity and handle high output power levels.

RF transistor amplifiers may be implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented using High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. A die or chip may refer to a small block of semiconducting material or other substrate on which electronic circuit elements are fabricated. When multiple RF transistor amplifier die are used, they may be connected in series and/or in parallel.

RF transistor amplifiers often include matching circuits, such as impedance matching circuits that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonics that may be generated during device operation, such as second and third order harmonics. Termination of harmonics also influences generation of intermodulation distortion products.

The RF transistor amplifier die(s) as well as the impedance matching and/or harmonic termination circuits may be enclosed in an integrated circuit device package. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. The package typically includes an attachment surface or "flange" on which the dies are mounted, an electrically insulating encapsulant material, such as plastic or ceramic, that seals and protects the dies from moisture and dust particles. Electrically conductive leads (also referred to herein as package leads or RF leads) may extend from the package, and are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within the Group III nitride-based RF amplifier die(s) during operation. If the RF transistor amplifier die(s) become too hot, the performance (e.g., output power, efficiency, linearity, gain, etc.) of the RF transistor amplifier may deteriorate and/or the RF transistor amplifier die(s) may be damaged. As such, Group III nitride-based RF transistor amplifiers are typically mounted in packages that may be optimized for heat removal.

In some package designs, the flange of the package includes a thermally conductive substrate, also referred to herein as a "heat slug" or "heat sink." A package level heat slug is designed to pull heat away from the integrated circuits and toward an external heat sink. Typically, the heat slug is formed from a thermally conductive material (e.g., metal). In some package configurations, the heat slug also serves as an electrical terminal that provides a reference potential (e.g., ground) to the dies that are mounted thereon. For example, the flange may be a CPC (copper, copper-molybdenum, copper laminate structure) or copper flange that provides both an attachment surface for the dies and a heat slug.

One semiconductor package design is an "open air-cavity" or "open-cavity" package, in which a (typically ceramic) lid is placed over a metal heat slug. The ceramic lid seals an open-air cavity that includes the RF transistor amplifier dies and/or other integrated circuits and associated electrical connections. The package leads of the open air-cavity ceramic package may be attached to the heat slug using a high temperature brazing process.

Another semiconductor package design is a molded design (or "overmold" package), in which a plastic or other non-conductive material is molded (e.g., by injection or transfer molding) directly on to the heat slug to form a solid structure that directly contacts and encapsulates the RF transistor amplifier dies and/or other integrated circuits and associated electrical connections as well as the heat slug. The package leads of a molded plastic package may be attached to the heat slug using a lead frame, in which an outer frame that includes the package leads is placed around the heat slug.

A typical RF power amplifier for base station applications may be a dual path device, including a semiconductor device (e.g., a transistor die), an input and an output pre-match network for each RF signal path, and wirebonds. For example, an RF signal path can refer to a class AB dual-path driver amplifier, or the carrier or peaking amplifier of a Doherty amplifier, which may be implemented in an open-cavity package or an over-molded package. Due to the proximity of the two RF signal paths, there may be electromagnetic coupling produced by the wire bond arrays and/or the semiconductor devices. When the semiconductor devices do not share the same substrate, the coupling between the wire bond arrays may be a dominating contributor to the coupling between the two RF signal paths. This coupling may modulate the load and deteriorate the overall RF performance. Decoupling structures may be provided in the middle of the package (e.g., between RF signal paths) to reduce this coupling and improve RF performance.

SUMMARY

According to some embodiments, a transistor amplifier package includes a base, one or more transistor dies on the base, and first and second leads coupled to the one or more transistor dies. The first and second leads define respective radio frequency (RF) signal paths. An isolation structure is provided between the respective RF signal paths. The isolation structure includes first and second wire bonds in a crossed configuration defining at least one cross point therebetween.

In some embodiments, the base may include a conductive element that is configured to provide an electrical ground for the one or more transistor dies. The first and second wire bonds may be coupled to the conductive element and/or to respective bond pads that are electrically connected to the conductive element.

In some embodiments, the isolation structure may include a plurality of crossed wire bond structures arranged in one or more dimensions between the respective RF signal paths. A respective one of the crossed wire bond structures may include the first and second wire bonds in the crossed configuration.

In some embodiments, at least one of the first and second wire bonds may include a plurality of wire bonds, such that the first and/or second wire bonds cross two or more of the plurality of wire bonds.

In some embodiments, the respective bond pads may include bond pads on a surface of the one or more transistor dies and/or bond pads on a surface of one or more passive devices on the base.

In some embodiments, the isolation structure may continuously extend between the respective RF signal paths, and the first and second wire bonds may define multiple cross points therebetween.

In some embodiments, the respective RF signal paths may include first and second RF amplifier paths. The first and second leads may be first and second input leads or first and second output leads of the first and second RF amplifier paths, respectively. The one or more transistor dies may include first and second transistor dies coupled to the first and second leads, respectively.

In some embodiments, the first and second wire bonds may be coupled to the respective bond pads. The respective bond pads may include bond pads that are on the first and second transistor dies of the first and second RF amplifier paths and/or bond pads that are on respective passive devices coupled to the first and second transistor dies.

In some embodiments, the conductive element may include a ground connection lead between the first and second input leads or between the first and second output leads.

In some embodiments, the conductive element may be a surface of the base including the one or more transistor dies thereon, and the base may be free of a ground connection lead.

In some embodiments, the isolation structure may be a first isolation structure between the first and second RF amplifier paths. A second isolation structure may be provided on at least one of the first and second transistor dies between input and output RF signal paths of a corresponding one of the first and second RF amplifier paths. The second isolation structure may include respective wire bonds in a linear configuration extending parallel to one another, or in a crossed configuration defining at least one cross point therebetween.

In some embodiments, the respective RF signal paths may include input and output RF signal paths of a RF amplifier path. The first and second leads may be input and output leads of the RF amplifier path, respectively. The one or more transistor dies may include a first transistor die coupled between the input and output leads.

In some embodiments, the respective bond pads may be on a surface of the first transistor die, and each of the first and second wire bonds may be coupled to multiple of the respective bond pads.

In some embodiments, the first and second wire bonds may be separated from one another by less than 5 mils.

In some embodiments, at a cross point between the first and second wire bonds, the first and second wire bonds may be separated from one another by about 2 mils or less.

In some embodiments, respective loop heights of the first and second wire bonds from the base may be at least a height of the one or more transistor dies from the base.

In some embodiments, respective loop heights of the first and second wire bonds from the base may be different.

In some embodiments, the one or more transistor dies may include a gallium nitride-based high electron mobility transistor (HEMT).

In some embodiments, the one or more transistor dies may include a silicon-based laterally diffused metal oxide semiconductor (LDMOS) transistor.

In some embodiments, the one or more transistor dies may be configured to operate in at least a portion of one or more of the 0.6-1 GHz, 1.4-1.6 GHz (e.g., 1.427-1.527 GHz), 1.7-1.9 GHz, 1.8-2.2 GHz, 2.3-2.7 GHz (e.g., 2.3-2.4 GHz, 2.5-2.7 GHz), 3.3-4.2 GHz, 4.4-5.0 GHz, or 5.1-6.0 GHz frequency bands.

In some embodiments, the one or more transistor dies may be configured to operate at frequencies above 10 GHz.

In some embodiments, a housing of the transistor amplifier package may include a ceramic lid that defines an air cavity around the one or more transistor dies.

In some embodiments, a housing of the transistor amplifier package may include a plastic overmold that encapsulates the one or more transistor dies.

According to some embodiments, a transistor amplifier package includes a base, one or more transistor dies on the base, and first and second leads coupled to the one or more transistor dies. The first and second leads define respective radio frequency (RF) signal paths. An isolation structure is provided between the respective RF signal paths. The isolation structure includes first and second wire bonds that are separated from one another by less than about 5 mils.

In some embodiments, the first and second wire bonds may have a crossed configuration defining at least one cross point therebetween.

In some embodiments, at the at least one cross point, the first and second wire bonds may be separated from one another by about 2 mils or less.

In some embodiments, the isolation structure may include a plurality of crossed wire bond structures arranged in one or more dimensions between the respective RF signal paths, and a respective crossed wire bond structure may include the first and second wire bonds in the crossed configuration.

In some embodiments, at least one of the first and second wire bonds may include a plurality of wire bonds, such that the first and/or second wire bonds cross two or more of the plurality of wire bonds.

In some embodiments, the first and second wire bonds may have respective loop heights from the base that are at least a height of the one or more transistor dies from the base.

In some embodiments, the base may include a conductive element that is configured to provide an electrical ground for the one or more transistor dies, and the first and second wire bonds may be coupled to the conductive element and/or to respective bond pads that are electrically connected to the conductive element.

In some embodiments, the respective RF signal paths may include input and output RF signal paths of a RF amplifier path. The first and second leads may include input and output leads of the RF amplifier path, respectively. The first and second wire bonds may extend parallel to one another in a linear configuration between the input and output leads of the RF amplifier path.

In some embodiments, the isolation structure may continuously extend between the respective RF signal paths, and the first and second wire bonds may define multiple cross points therebetween.

According to some embodiments, a transistor amplifier package includes a base, one or more transistor dies on the base, and first and second leads coupled to the one or more transistor dies. The first and second leads define respective radio frequency (RF) signal paths. An isolation structure is provided between the respective RF signal paths. The isolation structure includes first and second wire bonds in a non-linear configuration coupled to the base and/or to the one or more transistor dies, and the base is free of a ground connection lead.

In some embodiments, the base may include a conductive layer that is configured to provide an electrical ground, and the first and second wire bonds may be coupled to respective bond pads of the one or more transistor dies that are electrically connected to the conductive layer.

In some embodiments, the first and second wire bonds may have a crossed configuration defining at least one cross point therebetween.

In some embodiments, at the at least one cross point, the first and second wire bonds may be separated from one another by about 2 mils or less.

In some embodiments, the isolation structure may include a plurality of crossed wire bond structures arranged in one or more dimensions between the respective RF signal paths, and a respective crossed wire bond structure may include the first and second wire bonds in the crossed configuration.

In some embodiments, the respective RF signal paths may include first and second RF amplifier paths. The first and second leads may be first and second input leads or first and second output leads of the first and second RF amplifier paths, respectively. The one or more transistor dies may include first and second transistor dies coupled to the first and second leads, respectively.

In some embodiments, each of the first and second wire bonds may be coupled between the conductive layer of the base and a respective one of the bond pads of the first or second transistor dies.

In some embodiments, each of the first and second wire bonds may be coupled between a respective one of the bond pads of the first transistor die and a respective one of the bond pads of the second transistor die.

In some embodiments, the respective RF signal paths may include input and output RF signal paths of a RF amplifier path. The first and second leads may be input and output leads of the RF amplifier path, respectively. The one or more transistor dies may include a first transistor die coupled to the input and output leads of the RF amplifier path.

In some embodiments, the respective bond pads may be on a surface of the first transistor die, and each of the first and second wire bonds may be coupled to multiple of the respective bond pads.

According to some embodiments, a transistor amplifier package includes a base, a transistor die on the base, and input and output leads coupled to the transistor die. The input and output leads define input and output radio frequency (RF) signal paths, respectively, of a RF amplifier path. An isolation structure is provided between the input and output RF signal paths. The isolation structure includes first and second wire bonds coupled to the base and/or to respective bond pads of the transistor die.

In some embodiments, the base may be a conductive layer that is configured to provide an electrical ground, and the respective bond pads of the transistor die may be electrically connected to the conductive layer.

In some embodiments, the first and second wire bonds may extend parallel to one another in a linear configuration between the input and output RF signal paths.

In some embodiments, the first and second wire bonds may have a crossed configuration defining at least one cross point between the input and output RF signal paths.

In some embodiments, the isolation structure may be a first isolation structure between the input and output RF signal paths of a first RF amplifier path. A second transistor die may be provided on the base with second input and output leads coupled to the second transistor die. The second input and output leads may define input and output RF signal paths, respectively, of a second RF amplifier path. A second isolation structure may be provided between the first and second RF amplifier paths. The second isolation structure may include first and second wire bonds in a crossed configuration defining at least one cross point therebetween.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 2A is a schematic plan view of an RF transistor amplifier package including wire bond-based isolation structures in non-linear configurations in accordance with various embodiments of the present disclosure.

FIGS. 2A1, 2A2, and 2A3 illustrate examples of non-linear configurations of wire bonds that may be used in isolation structures according to various embodiments of the present disclosure.

FIG. 3 is a schematic plan view of an RF transistor amplifier package including wire bond-based isolation structures including double stitch wire bonds in crossed configurations in accordance with various embodiments of the present disclosure.

DETAILED DESCRIPTION OF EMBODIMENTS

Figure 1A:
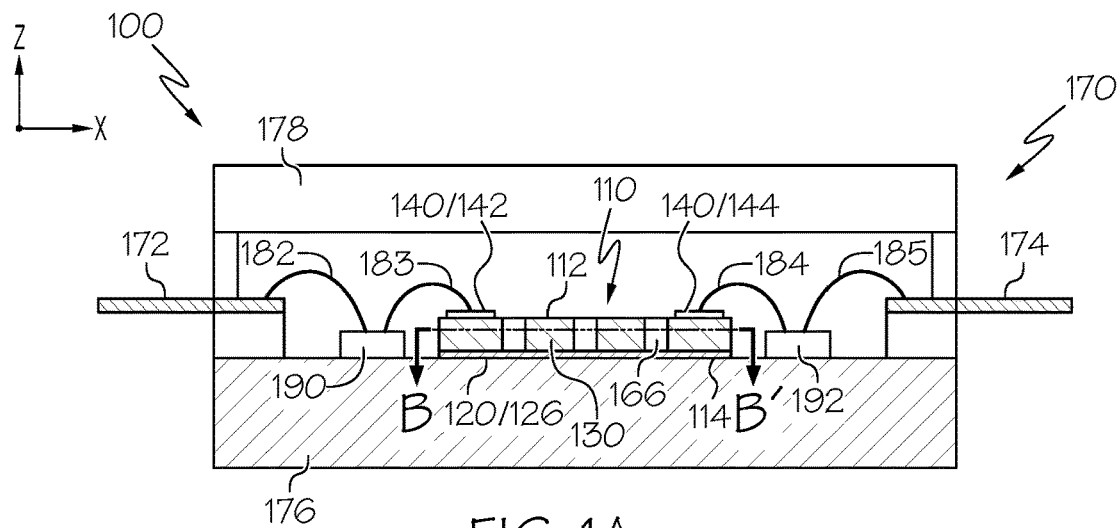
FIG. 1A is a schematic side view of a packaged Group III nitride-based RF transistor amplifier in accordance with various embodiments of the present disclosure.
Figure 1B:
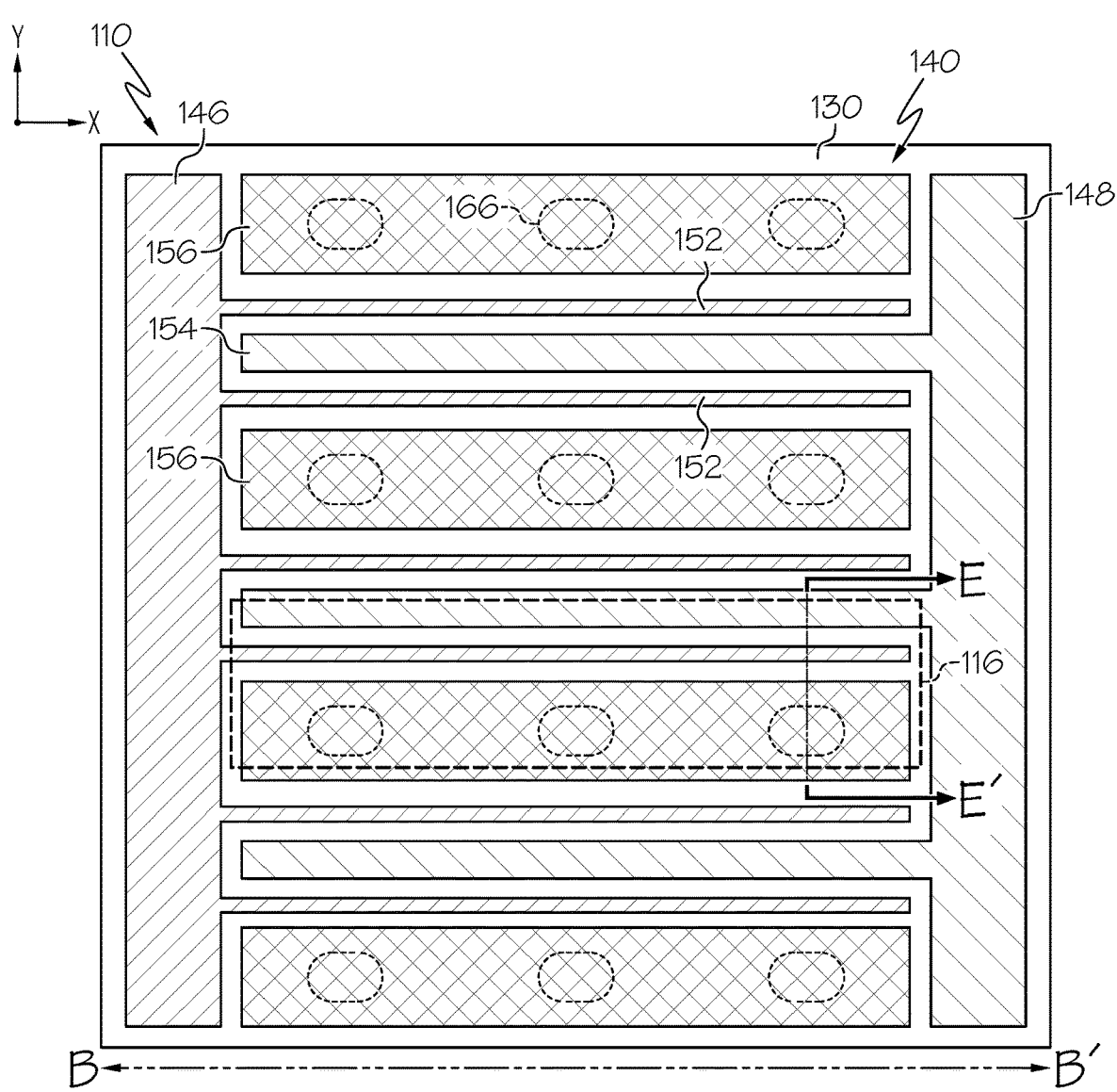
FIG. 1B is a schematic cross-sectional view of a RF transistor amplifier die in accordance with various embodiments of the present disclosure, where the cross-section is taken along line B-B' of FIG. 1A.
Figure 1C:
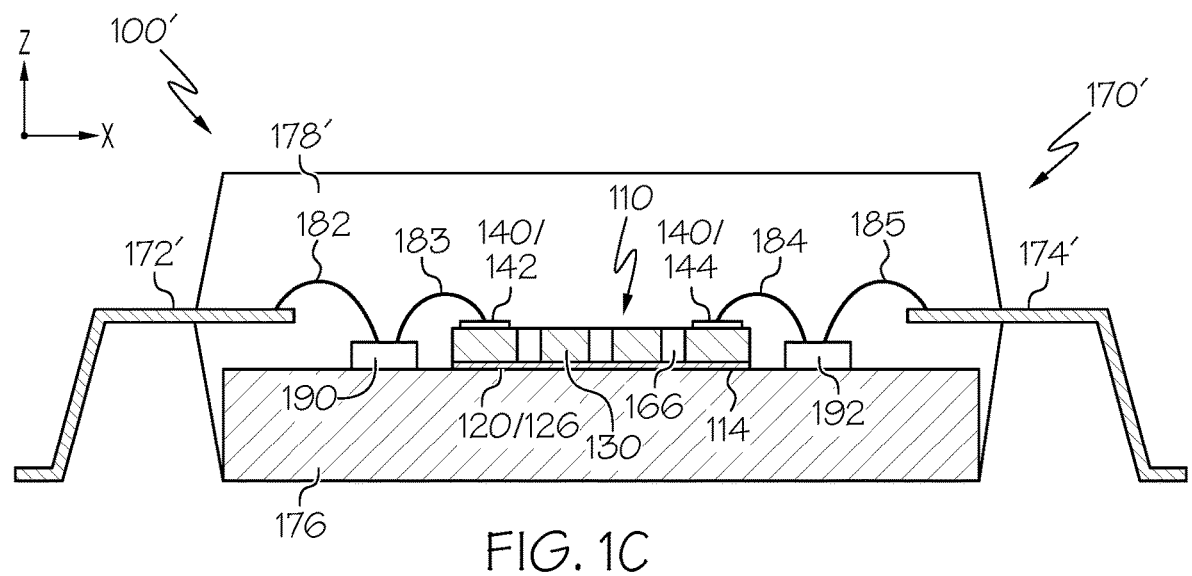
FIGS. 1C and 1D are schematic side views of alternative Group III nitride-based RF transistor amplifier packages in accordance with various embodiments of the present disclosure.
Figure 1D:
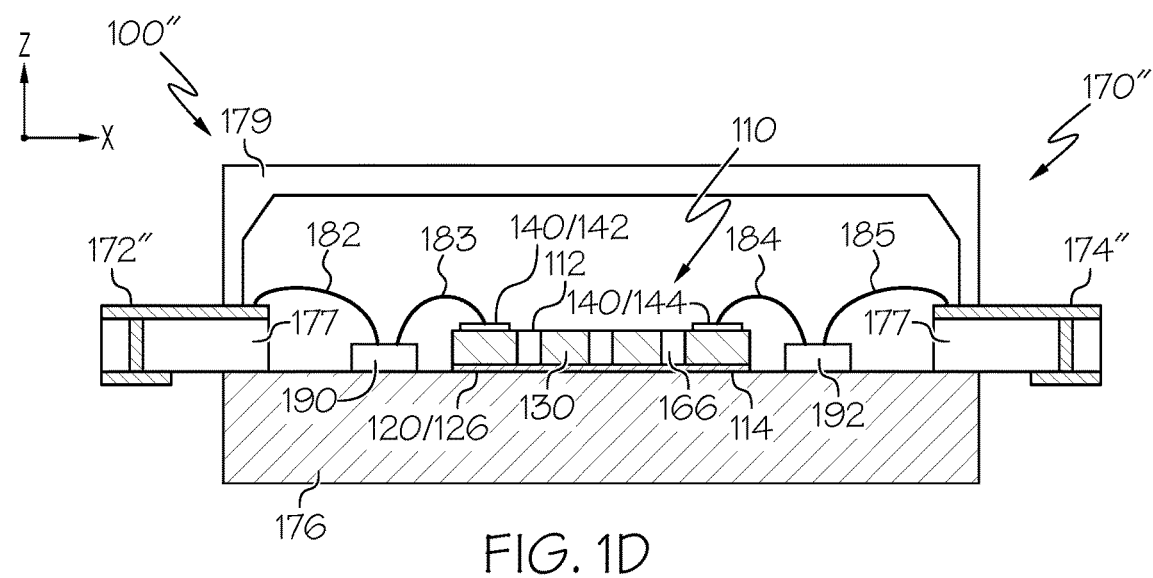
Figure 1E:
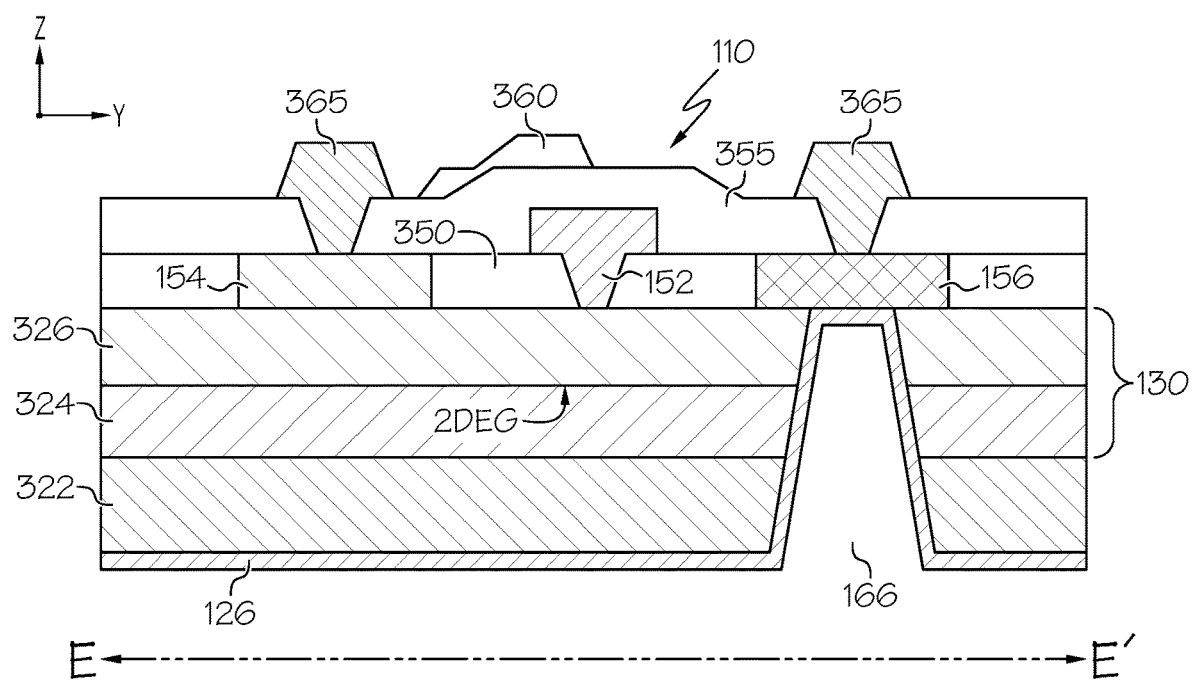
FIG. 1E is a schematic cross-sectional view of an RF transistor amplifier die unit cell in accordance with various embodiments of the present disclosure, where the cross-section is taken along line E-E' of FIG. 1B.

FIGS. 1A-1E illustrate example packaged Group III nitride-based RF transistor amplifiers in accordance with various embodiments of present disclosure. In particular, FIG. 1A is a schematic side view of a packaged Group III nitride-based RF transistor amplifier 100, and FIG. 1B is a schematic cross-sectional view of the RF transistor amplifier die 110 that is included in the packaged Group III nitride-based RF transistor amplifier 100, where the cross-section is taken along line B-B' of FIG. 1A. FIG. 1E is a schematic cross-sectional view of a unit cell 116 of the RF transistor amplifier die 110, where the cross-section is taken along line E-E' of FIG. 1B. FIGS. 1C and 1D are schematic side views of alternative Group III nitride-based RF transistor amplifier packages 170' and 170", respectively, in accordance with various embodiments of present disclosure. It will be appreciated that FIGS. 1A-1E (and various of the other figures) are highly simplified diagrams and that actual RF transistor amplifiers may include many more unit cells and various circuitry and elements that are not shown in the simplified figures herein. More generally, the figures herein are intended to represent structures for identification and description and are not intended to represent the structures to physical scale.

Packaged RF power devices as described herein may have open- or air-cavity and overmold configurations. In an open-cavity configuration, elements of the packaged RF power device such as the transistor die and/or components of a matching network may be disposed in an air cavity within the packaged RF power device. In an over molded plastic (OMP) configuration, elements of the packaged RF power device may be encased in a polymer material that surrounds and is in contact with the devices and bond wires of the packaged RF power device.

As shown in FIG. 1A, the Group III nitride-based RF transistor amplifier 100 includes an RF transistor amplifier die 110 that is mounted within an open cavity package 170, also referred to herein as a packaged transistor device. The package 170 includes a submount (also referred to herein as a base or flange) 176 including one or more electrically conductive RF leads thereon, for example, one or more input (e.g., gate) leads 172 and one or more output (e.g., drain) leads 174. The RF transistor amplifier die 110 is mounted on the upper surface of the submount 176. The submount 176 may be or may include an electrically conductive attachment surface, for example, a metal substrate (or "slug") that acts as a thermally conductive heat sink. In some embodiments, the submount 176 may additionally or alternatively include a redistribution layer (RDL) laminate structure including conductive layers fabricated using semiconductor processing techniques; a printed circuit board with metal traces; and/or a ceramic substrate that includes electrically conductive vias and/or pads. In some embodiments, a metal lead frame may be formed and then processed to provide the metal submount 176 and/or the RF leads (e.g., gate and drain leads) 172 and 174. RF transistor amplifier 100 also includes housing 178 (e.g., a ceramic lid or plastic overmold) that at least partially surrounds the RF transistor amplifier die 110, the RF leads 172, 174 and the metal submount 176.

The RF transistor amplifier die 110 has a top side 112 and a bottom side 114. The RF transistor amplifier die 110 includes a bottom side (also referred to as a "back" side) metallization structure 120, a semiconductor layer structure 130 and a top side metallization structure 140 that are sequentially stacked. The back side metallization structure 120 includes a metal source terminal 126. The RF transistor amplifier 100 may be a HEMT-based RF transistor amplifier, in which case the semiconductor layer structure 130 may include at least a channel layer 324 and a barrier layer 326, which are typically formed on a substrate 322 (see FIG. 1E, discussed in detail below). The substrate 322 may be a semiconductor or insulating growth substrate (such as a SiC or sapphire substrate). The growth substrate, even if formed of a non-semiconductor material, may be considered to be part of the semiconductor layer structure 130. The top side metallization structure 140 includes, among other things, a metal gate terminal 142 and a metal drain terminal 144.

Input matching circuits 190 and/or output matching circuits 192 may also be mounted within the housing 170. The matching circuits 190, 192 may be impedance matching circuits that match the impedance of the fundamental component of RF signals input to or output from the RF transistor amplifier 100 to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 1A, the input and output matching circuits 190, 192 may be mounted on the base 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184. The source terminal 126 of RF transistor amplifier die 110 may be mounted directly on the base 176.

The base 176 may provide the electrical connection to the source terminal 126 and may also serve as a heat dissipation structure. The first through fourth bond wires 182-185 may form part of the input and/or output matching circuits. The housing 178 may comprise a ceramic housing, and the gate lead 172 and the drain lead 174 may extend through the housing 178. The housing 178 may comprise multiple pieces, such as a frame that forms the lower portion of the sidewalls and supports the gate and drain leads 172, 174, and a lid that is placed on top of the frame. The interior of the device may comprise an air-filled cavity.

FIG. 1B is a schematic cross-sectional view of the RF transistor amplifier die 110 that is taken through a portion of the top side metallization structure 140. Dielectric layers that isolate the various conductive elements of the top-side metallization structure 140 from each other are not shown in FIG. 1B to simplify the drawing.

As shown in FIG. 1B, the RF transistor amplifier die 110 is illustrated by way of example as a Group III nitride-based HEMT RF transistor amplifier that has a plurality of unit cell transistors 116, where each unit cell transistor 116 includes a gate finger 152, a drain finger 154 and a source finger 156. It will be appreciated, however, that the RF transistor amplifier dies 110 may be implemented in a different technology such as, for example, a silicon LDMOS RF transistor amplifier. The gate fingers 152 are electrically connected to a common gate bus 146, and the drain fingers 154 are electrically connected to a common drain bus 148. The gate bus 146 is electrically connected to the gate terminal 142 (e.g., through a conductive via that extends upwardly from the gate bus 146) which is implemented as a gate bond pad (see FIG. 1A), and the drain bus 148 is electrically connected to the drain terminal 144 (e.g., through a conductive via that extends upwardly from the drain bus 148) which is implemented as a drain bond pad (see FIG. 1A). The source fingers 156 are electrically connected to the source terminal 126 via a plurality of conductive source vias 166 that extend through the semiconductor layer structure 130. The conductive source vias 166 may comprise metal-plated vias that extend completely through the semiconductor layer structure 130.

Referring again to FIG. 1A, the base 176 may be or may include a metal flange or metal slug that acts as a heat sink that dissipates heat that is generated in the RF transistor amplifier die 110. The heat is primarily generated in the upper portion of the RF transistor amplifier die 110 where relatively high current densities are generated in, for example, the channel regions of the unit cell transistors 116. This heat may be transferred though the source vias 166 and the semiconductor layer structure 130 to the base 176. That is, the submount 176 may be a conductive base or flange that provides both an electrically conductive attachment surface for the components of the package 170, as well as a thermally conductive structure (e.g., a heat sink) for dissipating or otherwise transmitting heat generated by the components of the package 170 to outside of the package 170.

FIG. 1C is a schematic side view of a packaged Group III nitride-based RF transistor amplifier 100' that is similar to the RF transistor amplifier discussed above with reference to FIG. 1A. RF transistor amplifier 100' differs from RF transistor amplifier 100 in that it includes a different package 170'. The package 170' includes a metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. RF transistor amplifier 100' also includes a plastic overmold 178' that at least partially surrounds the RF transistor amplifier die 110, the leads 172', 174' and the metal submount 176'.

FIG. 1D is a schematic side view of a packaged Group III nitride-based RF transistor amplifier 100" that is similar to the RF transistor amplifier 100' discussed above with reference to FIG. 1C. RF transistor amplifier 100" differs from RF transistor amplifier 100' in that the leads 172", 174" are in a thermally enhanced integrated circuit device package 170". The internal components of the open cavity package 170" may be otherwise similar to any of the packages 170, 170' described herein. The open cavity package 170" includes a lid member 179 (e.g., a ceramic lid, such as alumina) and sidewall members 177 (e.g., printed circuit board (PCB)) on a submount 176. The lid 179 and sidewalls 177 seal an open-air cavity that includes the RF transistor amplifier die 110 and/or other integrated circuits and associated electrical connections, for example, as shown in FIG. 1A. In the example of FIG. 1D, the leads 172" and 174" are supported by the PCB 177 and provide input and output RF leads that provide RF signal connections to the die 110 via the matching circuits 190 and 192, respectively.

Depending on the embodiment, the packaged transistor amplifier 100, 100', 100" can include, for example, a monolithic microwave integrated circuit (MMIC) as the RF transistor amplifier die 110 in which case the RF transistor amplifier die 110 incorporates multiple discrete devices. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172, 174 to the gate and drain terminals 142, 144. In some embodiments, the packaged RF transistor amplifier 100 can include multiple RF transistor amplifier dies that are connected in series to form a multiple stage RF transistor amplifier and/or may include multiple transistor dies that are disposed in multiple amplifier paths (e.g., in parallel) to form an RF transistor amplifier with multiple RF transistor amplifier dies and multiple paths, such as in a dual-path driver amplifier and/or a Doherty amplifier configuration.

Some RF package designs may use a grounded wire bond structure including a series of parallel wire bonds (also referred to as a straight wire bond geometry or configuration) to provide a decoupling structure that separates the respective RF signal paths or amplifier sections in the package and provides some degree of electromagnetic shielding. This type of structure can provide some isolation but may be limited by the minimum amount of space that can be maintained by the shield cross section.

Some embodiments of the present disclosure may arise from realization that, as higher frequencies of electromagnetic (EM) noise may require smaller spacings between the isolating wires to prevent the small wavelength portion of the spectrum from interfering, providing effective wire bond-based shields across a broad frequency range may be difficult. For example, manufacturing constraints may require a spacing between ends of adjacent wire bonds (also referred to as a pitch) of at least about 5 mils, which may be insufficient to provide the desired decoupling effects between adjacent RF signal paths, particularly for parallel or straight wire bond configurations. Other shortcomings of the straight wire bond geometry may include the need to accommodate additional space for the ground connections. For the conventional approach to work, center ground leads need to be added to the input and the output of the package, which may increase costs of the package.

Embodiments of the present disclosure provide isolation structures including wire bond configurations or geometries that can present a more favorable cross-section to reduce electromagnetic coupling/increase electrical isolation between adjacent RF signal paths (e.g., between paths of a dual-path amplifier or between main and peaking amplifiers of a Doherty amplifier) in RF transistor amplifier packages. In addition, embodiments of the present disclosure provide wire bond configurations or geometries for placement of both on and off chip wire bond connections to form the electromagnetic shielding between adjacent RF signal paths without the need for including additional ground leads in the package design.

As described herein, RF signal paths may refer to electrical connections (also referred to herein as RF signal connections) that provide RF signals for input to and/or output from components of the RF transistor amplifier package. For example, RF signal paths may provide RF signals to one or more transistor dies for operation in at least a portion of one or more of the 0.6-1 GHz, 1.4-1.6 GHz (e.g., 1.427-1.527 GHz), 1.7-1.9 GHz, 1.8-2.2 GHz, 2.3-2.7 GHz (e.g., 2.3-2.4 GHz, 2.5-2.7 GHz), 3.3-4.2 GHz, 4.4-5.0 GHz, or 5.1-6.0 GHz frequency bands, and/or at frequencies above 10 GHz. Each of the input and output leads or signal paths described herein may provide a respective RF signal path. Each of the side-by-side amplifier paths described herein may also provide a respective RF signal path.

In some embodiments of the present disclosure, an isolation structure includes first and second wire bonds in a non-linear configuration, for example, a crossed configuration having at least two wires arranged in a cross over pattern, also referred to herein as crossed wire bond structure or a crossed structure. Such non-linear wire bond-based isolation structures may be configured to attenuate interfering electromagnetic (EM) waves between RF signal paths, in some instances at higher frequencies than may be possible with straight wire bond configurations. For example, the geometry of the metal cross section defined by the cross over or other non-linear pattern(s) of the isolation structures described herein can be configured with the wire bonds closer to one another than the pitches that may be achievable under typical manufacturing constraints, to provide more effective shielding. In particular embodiments, as attenuating interfering EM waves may require a minimum wire spacing that correlates with the shortest wavelength present in the interfering EM spectrum, isolation structures including non-linear cross over patterns as described herein may be configured with wire bond spacings based on the wavelengths of the interfering EM spectrum to provide a more effective shield, which can be customized for desired operating frequencies.

Figure 2B:
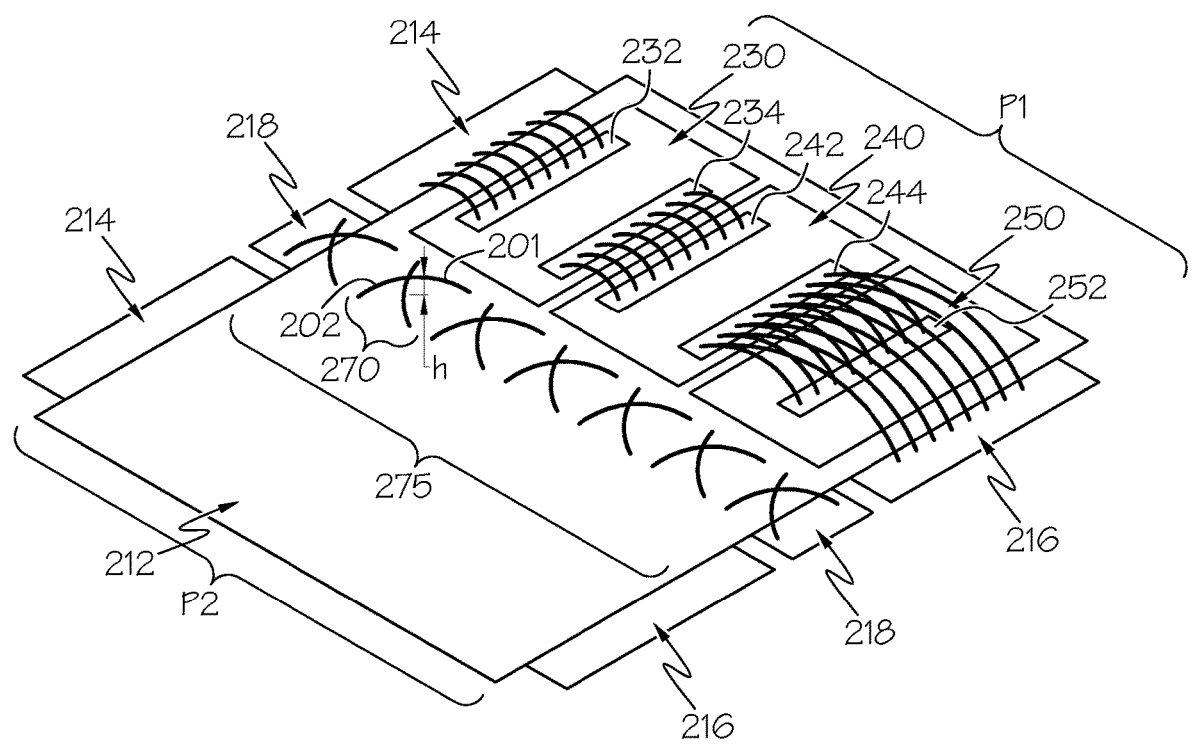
FIG. 2B is a schematic perspective view of the RF transistor amplifier package of FIG. 2A in accordance with various embodiments of the present disclosure.
Figure 3:
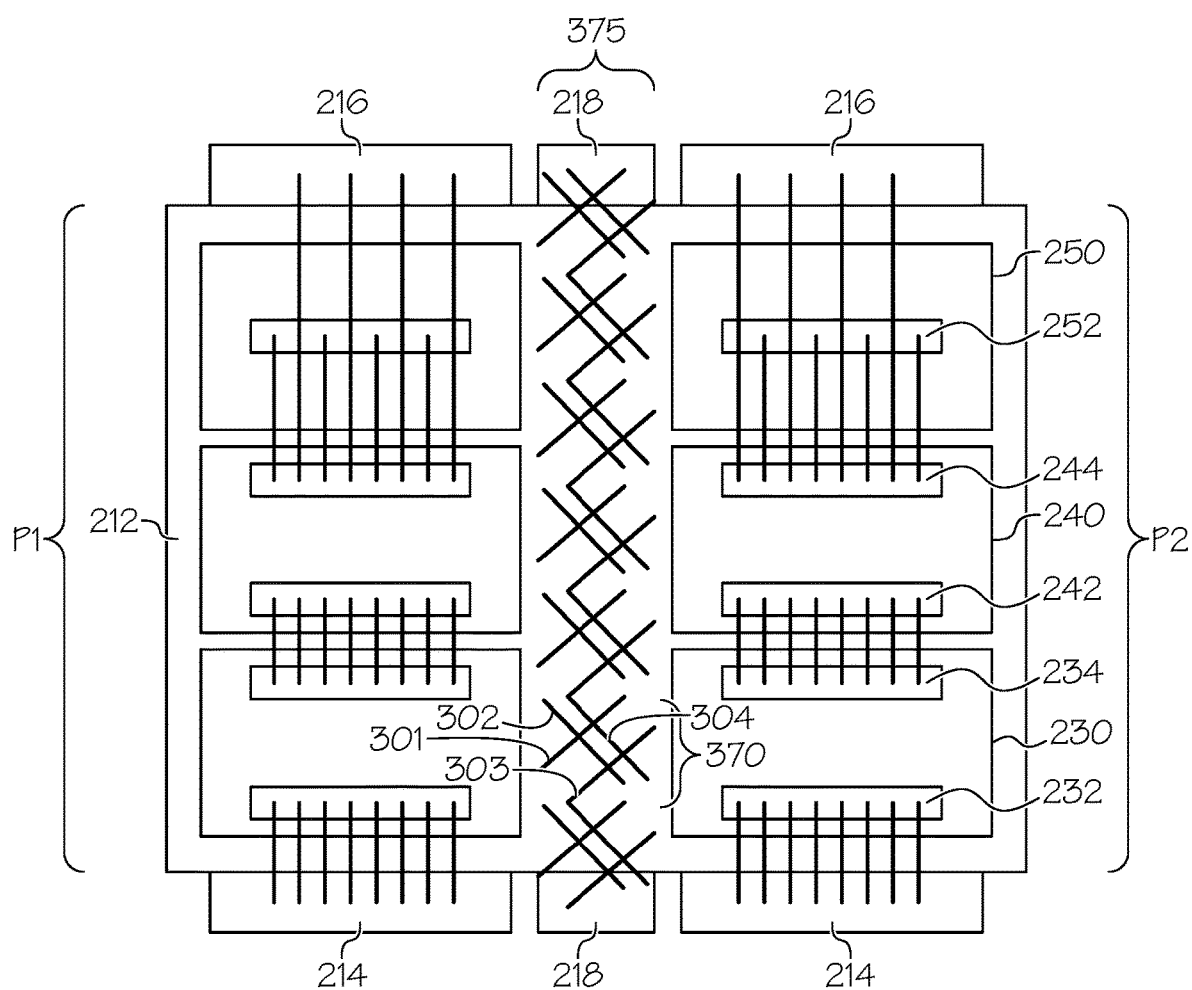

An example configuration of an isolation structure including multiple crossed wire bond structures in accordance with some embodiments of the present disclosure is shown in FIGS. 2A and 2B. As the number density or concentration (simply referred to herein as density for ease of discussion) of the cross points defined by intersections between respective e bonds may dictate an effectiveness of the isolation structure for reducing or blocking EM noise between RF signal paths, crossed configurations or geometries described herein can be configured to provide an increased number of cross points within the same board or submount surface area. An example configuration of an isolation structure including an increased density of crossed wire bonds in accordance with some embodiments of the present disclosure is shown in FIG. 3, where the crossed configurations are defined by "double-stitch" wire bonds.

Figure 4:
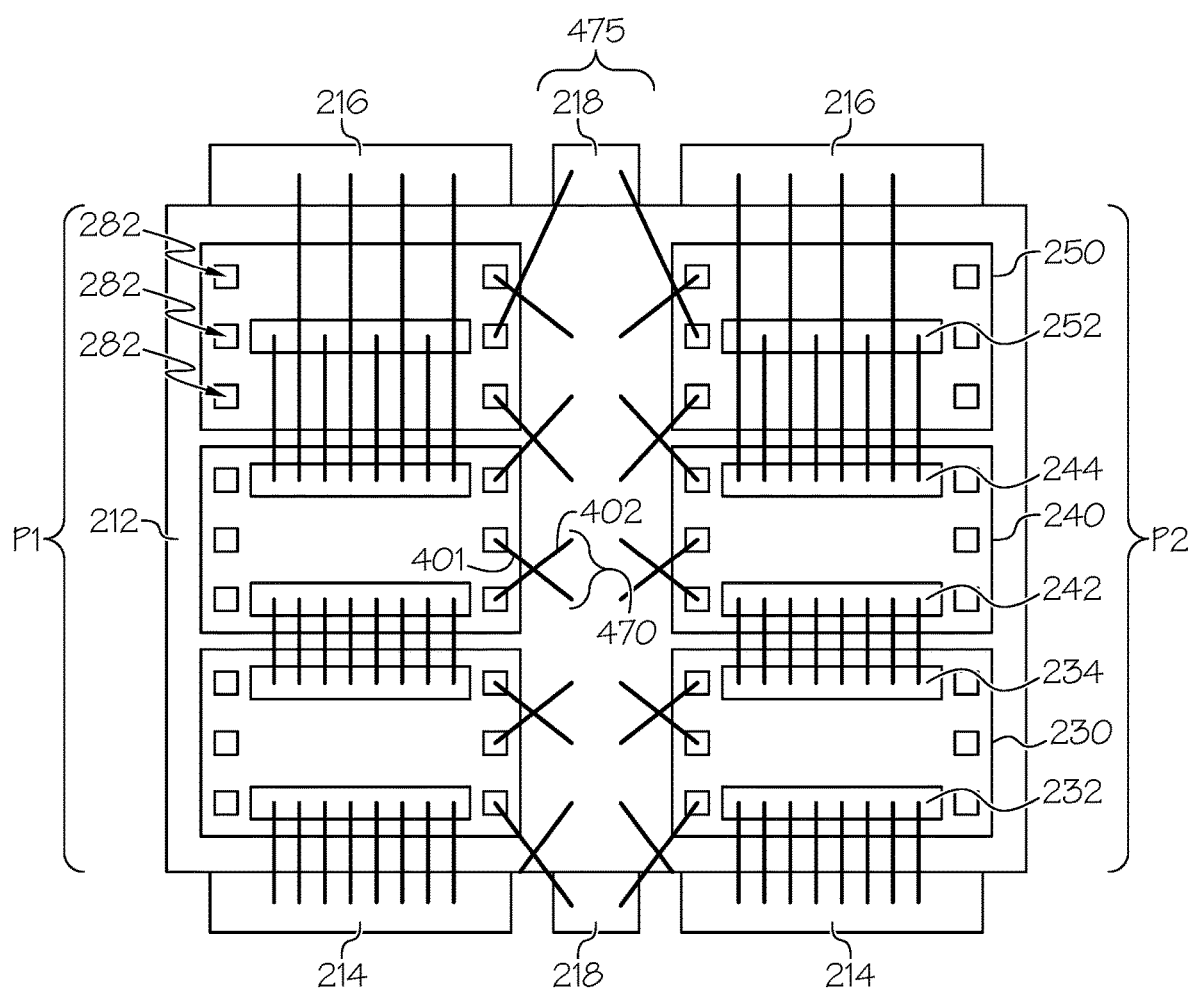
FIGS. 4, 5, and 6 are schematic plan views of RF transistor amplifier packages including wire bond-based isolation structures in non-linear configurations coupled to bond pads of one or more components of the packages in accordance with various embodiments of the present disclosure.
Figure 5:
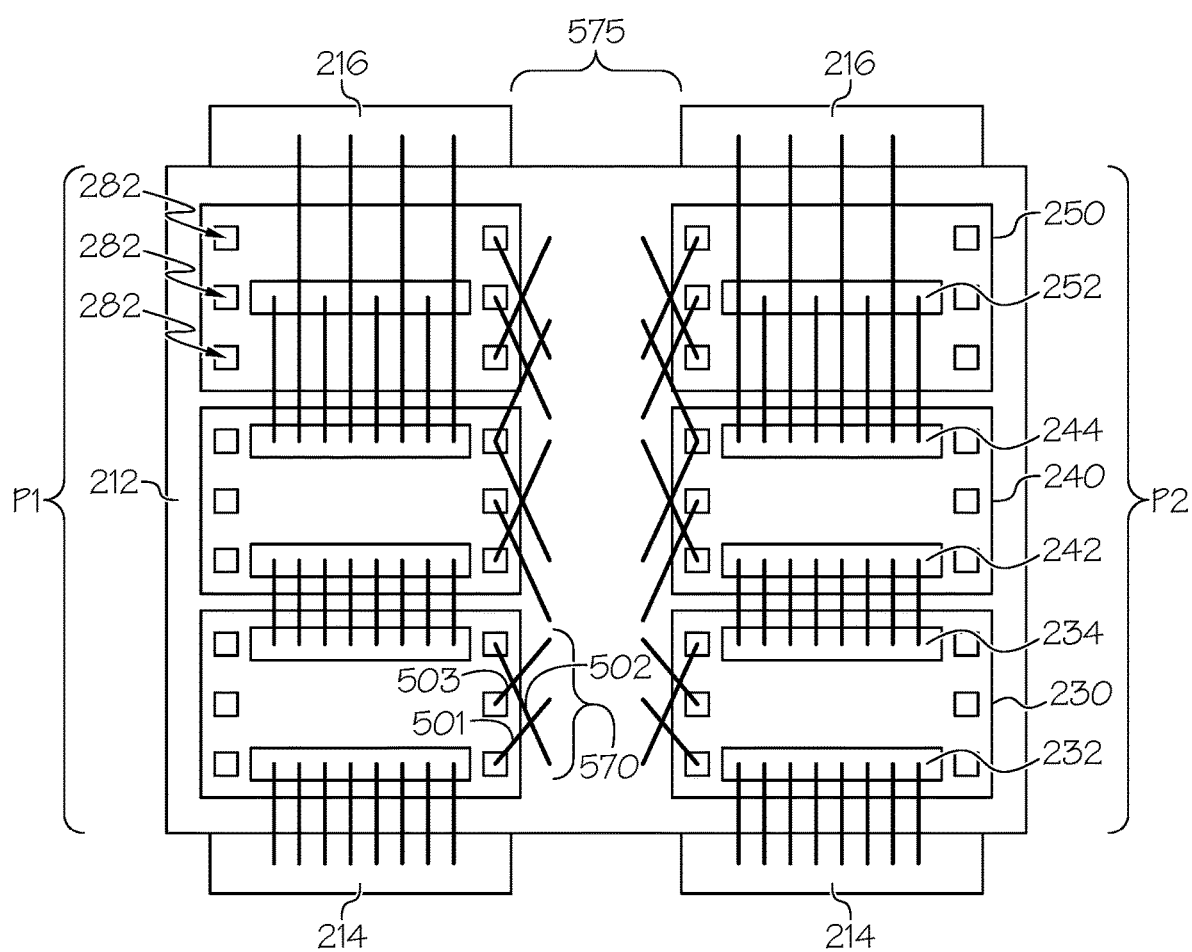
Figure 6:
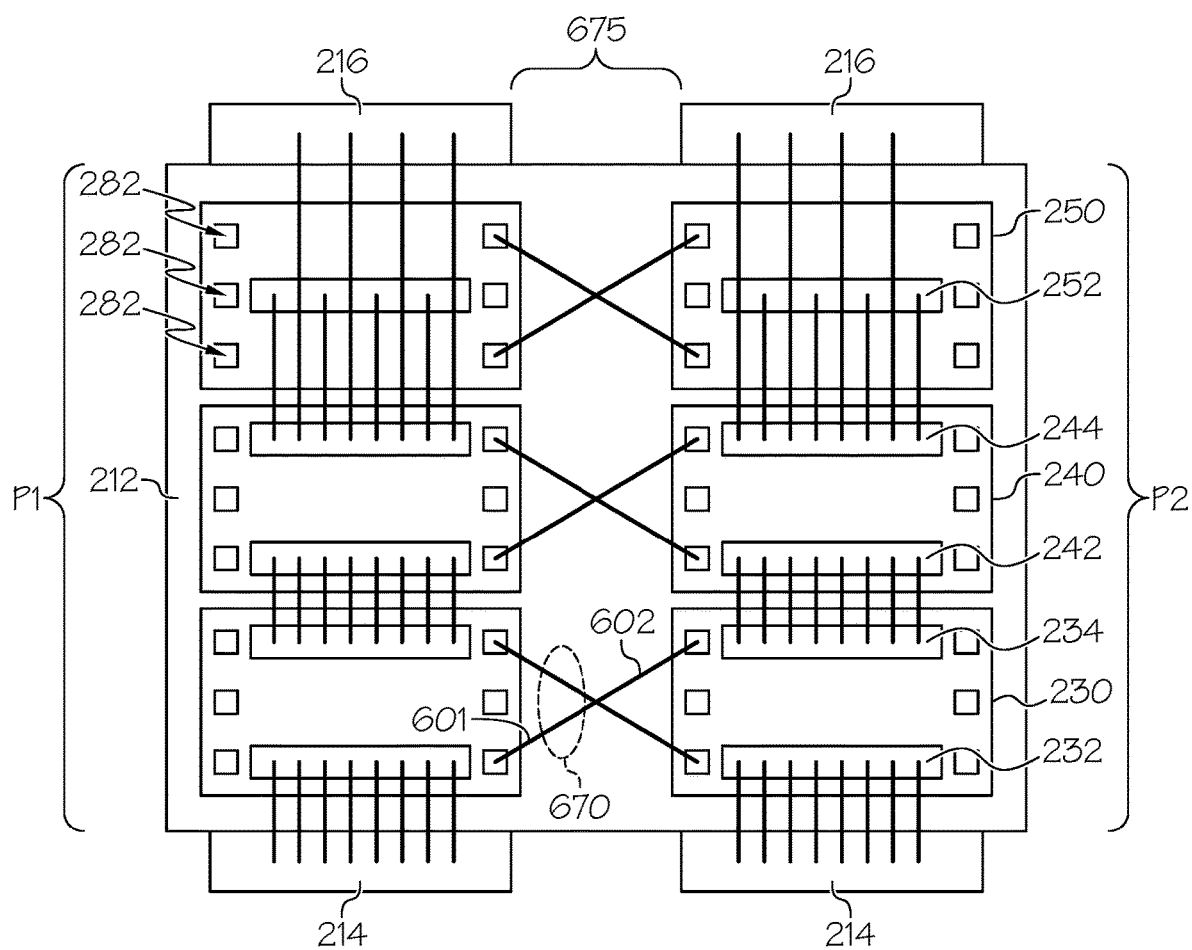

Wire bond-based isolation structures including cross over or other non-linear patterns in accordance with some embodiments of the present disclosure may also allow for both on-chip and off-chip connections, e.g., utilizing grounded bond pads on the semiconductor dies, as shown in the example configurations of FIGS. 4-6. Such configurations can provide effective ground contacts without added space in the package, which can reduce package size/costs and/or allow for a higher degree of integration on the board substrate or other base of the package.

Figure 7:
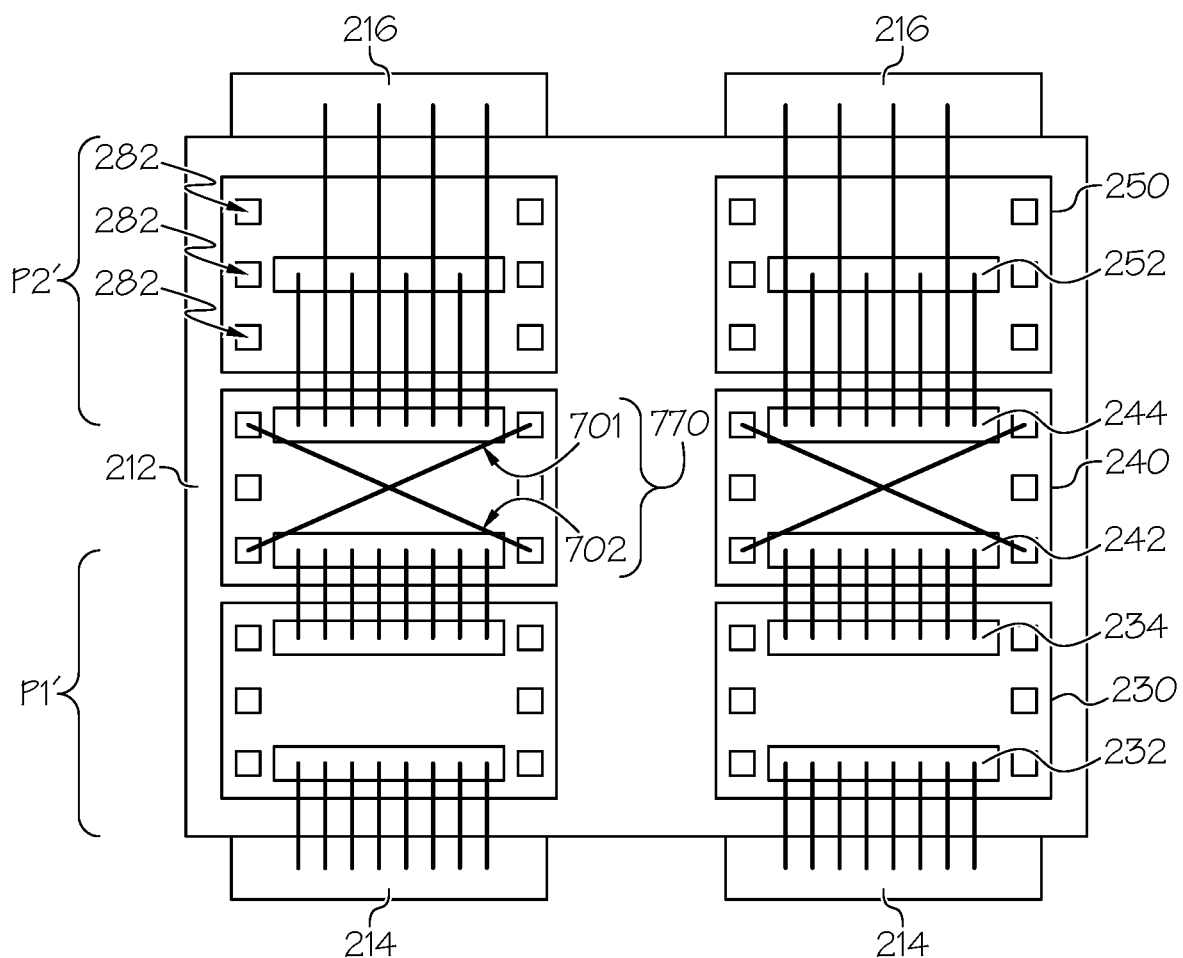
FIGS. 7, 8, and 9 are schematic plan views of RF transistor amplifier packages including wire bond-based isolation structures in non-linear configurations coupled between input and output RF signal paths in accordance with various embodiments of the present disclosure.
Figure 8:
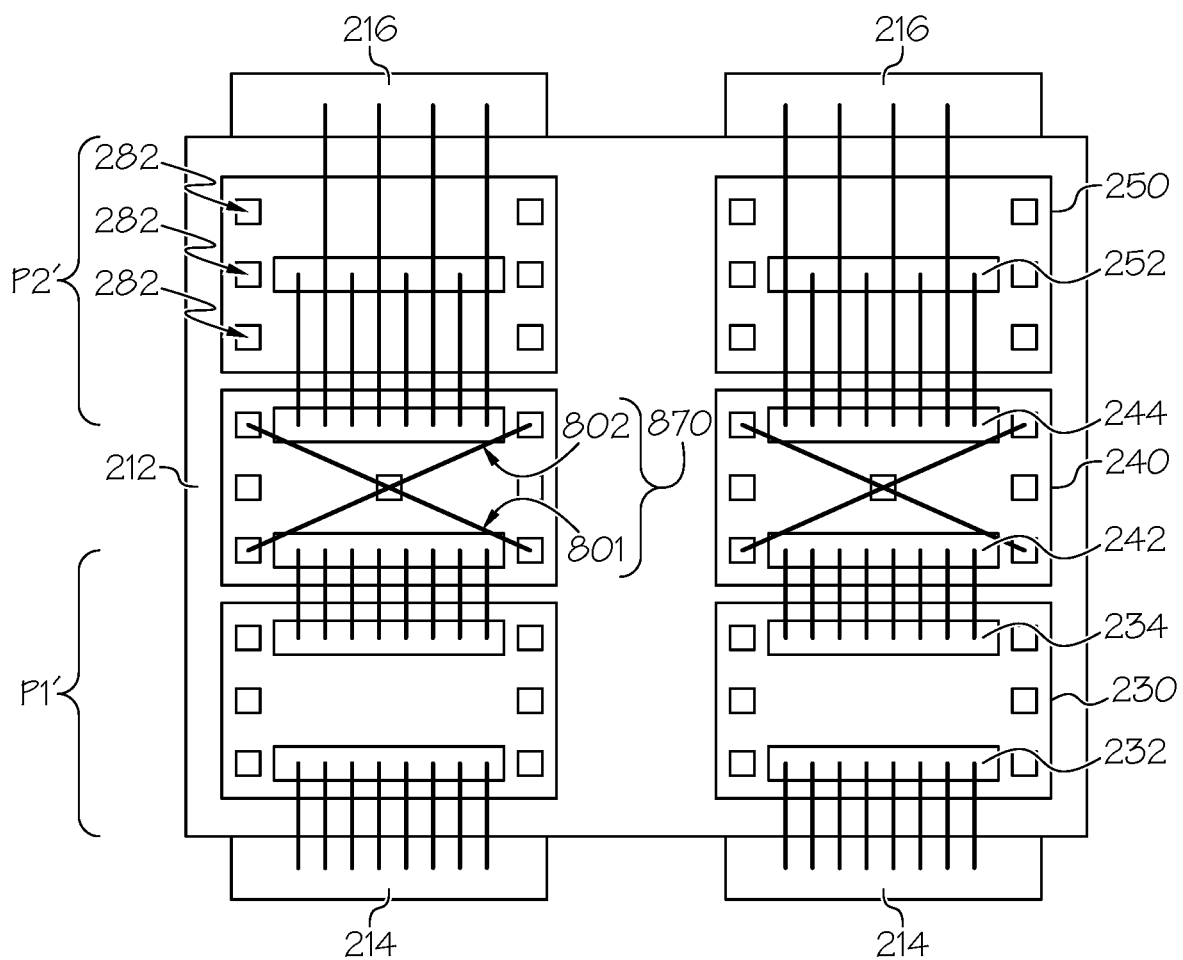
Figure 9:
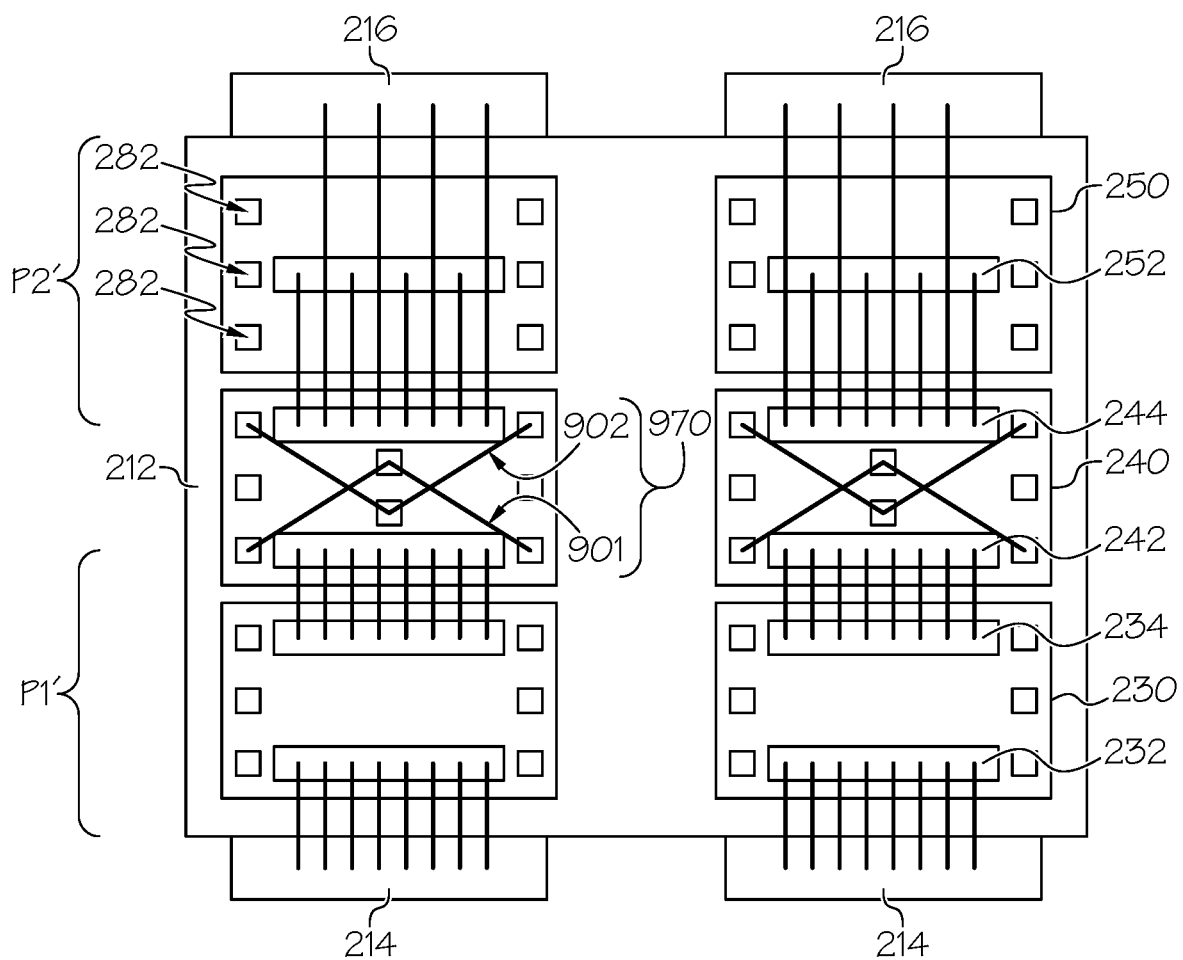

Wire bond-based isolation structures including cross over or other non-linear patterns as described herein may also be used to provide isolation between input and output signals of an RF amplifier path, that is, to reduce input-output coupling in the same RF signal path. Example configurations of isolation structures including crossed wire bonds in accordance with some embodiments of the present disclosure are shown in FIGS. 7-9, where one or more crossed structures are provided on portions of a transistor die, e.g., utilizing grounded bond pads on the semiconductor dies, to extend between and separate the input and output connections.

FIG. 2A is a schematic plan view of a radio frequency (RF) transistor amplifier package (also referred to herein as a package), and FIG. 2B is a schematic perspective view of the RF transistor amplifier package of FIG. 2A in accordance with various embodiments of the present disclosure. Several component of the amplifier package (e.g., the sidewall and lid 178 of FIG. 1A) are not shown for simplification. Elements of amplifier packages 170, 170', and 170" shown in FIGS. 1A-1D can be included in the amplifier package shown in FIGS. 2A and 2B.

Referring to FIGS. 2A and 2B, the package includes a base or submount 212 and one or more active transistor dies 240 provided on the submount 212. The active transistor dies 240 may be directly mounted on the submount 212 and may be coupled between electrically conductive RF input (e.g., gate) leads 214 and RF output (e.g., drain) leads 216 by bond wires 272, 274, 276, and 278 to define respective side-by-side RF signal paths P1 and P2 (also referred to herein as respective RF amplifier paths). The submount 212 may be similar to the submount 176, and may be or may include an electrically conductive element or surface, for example, but not limited to a conductive (e.g., metal) substrate, such as a heat slug or other heat sink; a RDL laminate structure including conductive layers fabricated using semiconductor processing techniques; a printed circuit board with metal traces; and/or a ceramic substrate that includes electrically conductive vias and/or pads. In some embodiments, the submount 212 may be formed of one or more thermally and electrically conductive materials, such as copper, aluminum, and alloys thereof. In some embodiments, the submount 212 may include a conductive layer that is configured to provide an electrical ground for one or more components of the package. As used herein, elements or components that are "coupled to" one another may be physically and/or electrically connected, with or without intervening elements or components therebetween.

The package includes two or more electrically conductive input and output leads 214 and 216 that are configured to provide RF signal connections to (i.e., to carry RF signals to or from) the transistor die(s) 240. In the depicted example, the RF transistor amplifier package includes one or more input leads 214 extending from a first side or edge of the package, and one or more output leads 216 extending from a second side or edge of the package opposite from the input leads 272. The package includes one or more electrically conductive elements that are configured to provide an electrical ground for the transistor die(s) 240, such as ground connection leads 218 and/or a conductive surface of the submount 212. The ground connection lead 218 may be provided between adjacent input leads 214 and/or between adjacent output leads 216. In the depicted example, the RF transistor amplifier package includes two ground connection leads 218 extending from the first and second sides or edges of the package, respectively. The number, size, and geometry of the leads 214, 216, 218 can vary. Moreover, the RF transistor amplifier package can be configured according to any of a wide variety of lead designs (e.g., bent lead, flat package, etc.). The leads 214, 216, 218 can include one or more electrically conductive materials, such as copper, aluminum, and alloys thereof.

In the depicted example, the RF transistor amplifier package includes two side-by-side amplifier paths P1 and P2 with respective active transistor dies 240 in each path P1 and P2; however the active transistor die 240 in the lower amplifier path P2 (between the lower-positioned leads 214 and 216 in FIG. 2B) is not shown for simplification. In some embodiments, the amplifier paths P1 and P2 may define respective RF signal paths of a Class AB dual-path driver amplifier, or may define the main and peaking amplifier paths of a packaged Doherty power amplifier. More generally, the RF transistor amplifier package can include any number of transistor dies 240 and amplifier paths P1, P2.

The active transistor die 240 can be configured as any of various transistor dies, e.g., MOSFETs (metal-oxide semiconductor field-effect transistor), LDMOS (laterally-diffused metal-oxide semiconductor) devices, or HEMT (high electron mobility transistor) devices. The transistor die(s) 240 can be configured as vertical devices, with a reference terminal (e.g., a source terminal) that directly faces and electrically contacts the submount 212. Alternatively, the transistor die(s) 240 can be configured as lateral devices that are configured to conduct in a lateral direction that is parallel to a surface of the submount 212. In addition, one or more passive devices 230, 250, (e.g., chip capacitors, inductors, etc.) may be mounted on submount 212 between the transistor dies 240 and the input and output leads 214 and 216, (e.g., as matching circuits).

Conductive electrical connections 272, 274, 276, and 278 electrically connect terminals of the active transistor dies 240 to the input and output leads 214 and 216. In the depicted example, these electrical connections 272, 274, 276, and 278 are provided by electrically conductive bond wires. The number and configuration of the bond wires may vary. More generally, any of a variety of commonly known electrical connection techniques, such as ribbon or conductive metallization, may also be used to complete these electrical connections 272, 274, 276, and 278.

In the example of FIGS. 2A and 2B, the input lead 214 is connected to an RF bond pad 232 of the input matching circuit 230 by one or more first bond wires 272; the RF bond pad 234 of the input matching circuit 230 is connected to a gate terminal 242 of the RF amplifier die 240 by one or more second bond wires 274; the output lead 216 is connected to the drain terminal 244 of RF amplifier die 240 by one or more third bond wires 276, and the RF bond pad 252 of the output matching circuit 250 is connected to the drain terminal 244 of the RF transistor amplifier die 240 by one or more fourth bond wires 278. The bond wires 272, 274, 276, and 278 may form part of the input and/or output matching circuits 230/250 in each amplifier path. In some embodiments, the input/output matching circuits 230/250 may be implemented by passive devices, such as integrated passive devices (IPDs). IPDs include inductors and/or other passive electrical components, and may be fabricated using standard semiconductor processing techniques such as thin film and/or photolithography processing. IPDs can be flip chip mountable or wire bondable components, and may include thin film substrates such as silicon, alumina, or glass.

Still referring to FIGS. 2A and 2B, the source terminal of RF transistor amplifier die 240 may be mounted directly on the submount 212, which may provide the electrical connection to the source terminal and may also serve as a heat dissipation structure. The amplifier die 240, input/output matching circuits implemented by passive devices 230/250 and/or other components of the lower amplifier path P2 (between the lower-positioned leads 214 and 216 in FIG. 2B) are not shown for simplification. Although not shown, a housing (e.g., a plastic overmold 178' in FIG. 1C or a ceramic lid 179 in FIG. 1D) encapsulates the components of the respective amplifier paths P1, P2. At least portion of each of the input leads 214 and the output leads 216 of the respective amplifier paths P1, P2 extend outside the housing for connection to external device(s).

According to some embodiments of the present disclosure, the package includes an isolation structure 275 that is configured to reduce coupling and increase electrical isolation between adjacent RF signal paths, such as the amplifier paths P1, P2. The isolation structure 275 separates the amplifier paths P1, P2 and provides electromagnetic (EM) shielding by attenuating EM noise (also referred to herein as interfering EM waves). The isolation structure 275 includes one or more non-linear (e.g., crossed) wire bond structures 270. A respective crossed wire bond structure 270 includes first and second wire bonds 201 and 202 crossing or intersecting each other, also referred to herein as a crossed configuration or cross over pattern. The isolation structure 275 may include multiple crossed structures 270 arranged on the submount 212 in one or more dimensions between the amplifier paths P1, P2 (e.g., along a direction of the amplifier paths P1, P2), which collectively define an isolation fence in a mesh pattern. In the examples of FIGS. 2A and 2B, the respective crossed structures 270 are arranged in a column between the amplifier paths P1 and P2, and are spaced apart or separated from one another along the direction of the amplifier paths P1, P2. However, it will be understood that embodiments of the present disclosure are not limited to this arrangement/spacing. For example, in some embodiments, the isolation structure 275 may include multiple rows and/or columns of crossed wire bond structures between the amplifier paths P1, P2. The cross over pattern or crossed configuration 270 of the first and second wire bonds 201, 202 may be configured to provide effective attenuation of high frequency EM noise (e.g., noise having a frequency of from about 6 GHz to about 60 GHz) by reducing a spacing between the first and second wire bonds 201 and 202 and/or by increasing in a number of cross points defined by respective intersections of the first and second wire bonds 201 and 202 of the isolation structure 275.

In the example of FIGS. 2A and 2B, the crossed structures 270 adjacent to the respective ground connection leads 218 may be coupled to the ground connection leads 218 as depicted in FIG. 2A. Each of the first and second wire bonds 201 and 202 of the crossed structures 270 adjacent to the ground connection leads 218 may be coupled to the ground connection leads 218 and to the surface of the submount 212. The crossed structures 270 more distant from the ground connection leads 218 may be coupled to the surface of the submount 212, but may not be coupled to the ground connection lead 218. The crossed structures 270 coupled to the submount 212 may be coupled to the electrical ground provided by the submount 212.

FIGS. 2A1, 2A2, and 2A3 illustrate examples of non-linear configurations 270, 270', and 270" of first and second wire bonds 201 and 202 that may be used in isolation structures according to some embodiments of the present disclosure. It will be understood that, while illustrated primarily herein with reference to example embodiments of isolation structures including the crossed configuration 270, the non-linear configurations 270' and/or 270" may be used interchangeably with one or more of the crossed structures 270 in any of the embodiments described herein. As shown in FIGS. 2A1, 2A2, and 2A3, ends of the first and second wire bonds 201 and 202 of a respective non-linear wire bond structure 270, 270', 270" may be separated from each other by a distance or pitch p. For example, ends of the first and second wire bonds 201 and 202 of respective non-linear wire bond structure 270, 270', 270" may be spaced apart from each other by from about 2 mils to about 15 mils, from about 4 mils to about 10 mils, or from about 5 mils to about 8 mils in a width direction of the package. The width direction of the package may traverse (e.g., may be perpendicular to) a direction of direction of the amplifier paths P1, P2. In some embodiments, the ends of the first and second wire bonds 201 and 202 of a respective non-linear wire bond structure 270, 270', 270" may be spaced part from each other by about 5 mils or less, for example, by about 2 mils in the width direction of the package.

The first and second wire bonds 201 and 202 of a respective non-linear wire bond structure 270, 270', 270" may each have a same or different loop height h relative to the surface of the submount 212. The loop height may refer to a distance between a highest or peak portion of a wire bond and the surface to which the wire bond is attached, which in some embodiments may be up to about 50 mils. In some embodiments, respective loop heights of the first and/or second wire bonds 201/202 from the submount 212 may be at least the height of the RF amplifier die 240. For example, the respective loop heights of the first and/or second wire bonds 201/202 of a respective non-linear wire bond structure 270, 270', 270" may be about 25 mils, 30 mils, 35 mils, 40 mils, 45 mils, 50 mils, or 55 mils. The respective loop heights of the first and second wire bonds 201 and 202 of a respective non-linear wire bond structure 270, 270', 270" can be independently controlled to about +/−2 mils in some embodiments. As such, a difference in the respective loop heights of the first and second wire bonds 201 and 202 of a respective non-linear wire bond structure 270, 270', 270" may be about 4 mils (+/−2 mils for each wire bond) or less. In some embodiments, the respective loop heights of the first and second wire bonds 201 and 202 may be formed to intentionally differ. In some embodiments, there may be substantially no difference in the respective loop heights of the first and second wire bonds 201 and 202.

As shown in FIGS. 2A1, 2A2, and 2A3, a spacing s between the first and second wire bonds 201 and 201 of a respective non-linear wire bond structure 270, 270', 270", may be defined by the differences in the respective loop heights and/or by bending the first and second wire bonds 201 and 202 towards or away from one another. In some embodiments, the first and second wire bonds 201 and 202 of a respective non-linear wire bond structure 270, 270', 270" may be separated from one another by a spacing s of less than 5 mils, e.g., by about 4 mils or less, by about 3 mils or less, by about 2 mils or less, or by about 1 mil or less. In some embodiments, the spacing s may be defined at a respective intersection or cross point between the first and second wire bonds 201 and 202.

In some embodiments, each of the first and second wire bonds 201 and 202 of a respective non-linear wire bond structure 270, 270', 270" may be a metal wire that includes gold, copper and/or aluminum. For example, the first and second wire bonds 201 and 202 may be gold wires, copper wires or aluminum wires. A diameter of the first and second wire bonds 201 and 202 may be in a range of from 0.5 mils to 2.5 mils. In some embodiments, the diameter of the first and second wire bonds 201 and 202 may be in a range of from 0.7 mils to 2.0 mils, from 0.7 mils to 1.0 mil.

As compared to isolation structures having a straight wire bond geometry, the smaller spacings and/or higher densities provided by isolation structures including first and second wire bonds and in a non-linear configuration 270, 270', 270" as described herein may be more effective in reducing coupling between adjacent RF signal paths. In particular, the smaller spacings between the first and second wire bonds 201 and 202 of a respective crossed structure 270 and/or the density of the crossed structures 270 that collectively define the isolation structure 275 may define a mesh pattern with reduced separation between wire bonds (that is, with the wire bonds separated by less than 5 mils, for example, by about 2 mils or less at a respective cross point). Such an isolation structure 275 may thereby be more effective in blocking higher frequency/shorter wavelength EM interference, as the wavelengths blocked may be proportional to the size of the gaps or spacings between the wire bonds 201 and 202 (e.g., wavelengths shorter than the gaps between wire bonds may pass through the isolation structure).

FIGS. 3 through 10 are schematic plan views of RF transistor amplifier packages including wire bond-based isolation structures in non-linear configurations in accordance with various embodiments of the present disclosure. While illustrated primarily with reference to crossed wire bond configurations 370, 470, 570, 670, 870, 970, and 1070, it will be understood that other non-linear wire bond configurations (e.g., non-linear wire bond structures 270' and/or 270" of FIGS. 2A2 and/or 2A3) may be used interchangeably in any of the embodiments described herein.

Referring to FIG. 3, an isolation structure 375 between adjacent RF signal paths P1, P2 includes crossed wire bond structures 370 that include double stitch wire bonds 301-304, where each wire bond may intersect with or cross two or more wire bonds. For example, as shown in FIG. 3, a respective double stitch wire bond structure 370 includes multiple first wire bonds 301, 303 crossing multiple second wire bonds 302, 304. In the respective crossed structures 370, the spacing between the wire bonds 301-304 is reduced in one or more dimensions (e.g., along the directions of the RF signal paths, along the width of the package, and/or along the loop heights) and the number/density of cross points defined by respective intersections of the wire bonds 301-304 is increased in comparison to the crossed structures 270 of FIGS. 2A and 2B, within a same or substantially similar surface area on the submount 212. As such, the isolation structure 375 collectively defined by multiple double stitch wire bond structures 370 along a direction of the amplifier paths P1, P2 provide an isolation fence in a mesh pattern having an increased density of cross points, thereby providing EM shielding that is configured to more effectively block EM noise at higher frequencies.

In the embodiment depicted in FIG. 3, two first wire bonds 301, 303 cross over two second wire bonds 302, 304 to define four intersections in a respective crossed structure 370. However, the number of wire bonds 301-304 in a respective double stitch wire bond structure 370 can vary. For example, in some embodiments, a crossed structure 370 may include three or more first wire bonds that may cross over one or more second wire bonds, or a single first wire bond may cross over two or more second wire bonds. More generally, while illustrated in FIG. 3 with reference to a particular implementation of a double stitch wire bond structure 370, it will be understood that fewer or more wire bonds and cross points may be provided. Similarly, while illustrated with reference to each crossed wire bond structure 370 having a same number of wire bonds and cross points, it will be understood that the crossed wire bond structures 370 that collectively define the isolation structure 375 need not be identical.

The crossed structures 370 adjacent to the ground connection leads 218 may be coupled to the ground connection leads 218 as depicted in FIG. 3. Each of the wire bonds 301-304 of the crossed structures 370 adjacent to the ground connection leads 218 may be coupled to the ground connection leads 218 and to the submount 212. The crossed structures 370 more distal from the ground connection leads 218 may be coupled to the submount 212, but may not be coupled to the ground connection leads 218. The crossed structures 370 coupled to the submount 212 may be coupled to the electrical ground provided by the submount 212.

Referring to FIG. 4, an isolation structure 475 between adjacent RF signal paths P1, P2 includes non-linear (e.g., crossed) wire bond structures 470 that are coupled to the submount 212 and to respective bond pads 282 of the active transistor die 240 and/or one or more passive devices 230, 250 on the submount 212. In particular, in the example of FIG. 4, each of the crossed structures 470 includes first and second wire bonds 401 and 402 crossing each other, and each of the first and second wire bonds 401 and 402 is coupled to a respective bond pad 282 of the active transistor die 240, the passive device 230, and/or passive device 250. The passive devices 230 and/or 250 may define portions of the input matching circuit 230 and/or the output matching circuit 250. Although FIG. 4 depicts that a single wire bond (i.e., the first wire bond or the second wire bond) is coupled to a single bond pad 282, a number of wire bond coupled to a single bond pad 282 can vary. For example, two or more wire bonds may be coupled to a single bond pad 282.

The bond pads 282 may be coupled to the electrical ground provided by the conductive element(s) of the submount 212. For example, the active transistor dies 240 and/or the passive devices 230, 250 may include respective conductive vias 166 (see FIGS. 1A-1E) extending therethrough to electrically connect the bond pads 282 on the respective surfaces of the devices 230, 240, and/or 250 to a conductive attachment surface of the submount 212. At least one of the wire bonds 401 and 402 of the crossed structures 470 adjacent to the ground connection leads 218 between the amplifier paths P1, P2 may be coupled to the ground connection leads 218 as depicted in FIG. 4, with the other of the wire bonds 401 and 402 connected to a bond pad 282. The crossed structures 470 more distal from the ground connection leads 218 may be coupled between the submount 212 and respective bond pads 282 on the surfaces of the active transistor dies 240 and/or the passive devices 230, 250. The isolation structure 475 in the example of FIG. 4 is thus implemented as multiple columns of crossed wire bond structures 470 that are spaced apart from each other in the width direction of the package.

Referring to FIG. 5, an isolation structure 575 between adjacent RF signal paths P1, P2 includes non-linear (e.g., crossed) wire bond structures 570 that are coupled to the submount 212 and to respective bond pads 282 of the active transistor die 240 and/or one or more passive devices 230, 250 on the submount 212, as similarly shown in FIG. 4. In the example of FIG. 5, each of the crossed structures 570 includes multiple wire bonds 501, 502, and 503 crossing each other, and each of the wire bonds 501, 502, and 503 is coupled to the submount 212 and to a respective bond pad 282 of one of the active transistor die 240, the passive die 230 defining a portion of the input matching circuit, or the passive die 250 defining a portion of the output matching circuit. As in the example of FIG. 4, the active transistor dies 240 and/or the passive devices 230, 250 may include respective conductive vias 166 extending therethrough to electrically connect the bond pads 282 on the respective surfaces of the devices 230, 240, and/or 250 to a conductive attachment surface of the submount 212. The crossed structure 570 may include one wire bond 501, 502, or 503 crossing or intersecting multiple wire bonds 501, 502, and/or 503 as depicted in FIG. 5, but fewer or more intersections of the wire bonds 501, 502, and/or 503 may be provided. The isolation structure 575 thus includes multiple columns of crossed wire bond structures 570 that are spaced apart from each other in the width direction of the package.

In the example of FIG. 5, each amplifier path P1 and P2 includes a respective column of crossed wire bond structures 570 coupled to the components 230, 240, and/or 250 thereof, and the submount 212 does not include a ground connection lead 218 between the input leads 214 or between the output leads 216. As the submount 212 is free of the ground connection leads 218, a distance between the input leads 214 and between the output leads 216 of the respective amplifier paths P1 and P2 may be reduced, thereby allowing for reduction in the footprint or size of the RF transistor amplifier package.

Referring to FIG. 6, an isolation structure 675 between adjacent RF signal paths P1, P2 includes non-linear (e.g., crossed) wire bond structures 670 that are coupled between respective bond pads 282 of devices 230, 240, and/or 250 of different amplifier paths P1 and P2. In the example of FIG. 6, each of the crossed structures 670 includes first and second wire bonds 601 and 602 crossing each other, and each of the wire bonds 601 and 602 is coupled to a respective bond pad 282 of one of the active transistor die 240, the passive die 230 defining a portion of the input matching circuit, or the passive die 250 defining a portion of the output matching circuit of each amplifier path P1 and P2. In particular, a respective crossed structure 670 includes a first wire bond 601 and a second wire bond 602, and the first wire bond 601 extends from one of the active transistor die 240, the passive device 230, or the passive device 250 of the first amplifier path P1 onto one of the active transistor die 240, the passive device 230, or the passive device 250 of the second amplifier path P2. As in the examples of FIGS. 4 and 5, the active transistor dies 240 and/or the passive devices 230, 250 may include respective conductive vias 166 extending therethrough to electrically connect the bond pads 282 on the respective surfaces of the devices 230, 240, and/or 250 to a conductive attachment surface of the submount 212. The crossed structure 670 includes a single cross point defined by the wire bonds 601 and 602 as depicted in FIG. 6, but fewer or more intersections of the wire bonds 601 and 602 may be provided.

In the example of FIG. 6, a column of crossed wire bond structures 670 is provided between the amplifier paths P1 and P2, and couples one or more components 230, 240, and/or 250 of one amplifier path P1 to one or more components 230, 240, and/or 250 of the other amplifier path P2. Similar to the embodiment of FIG. 5, the submount 212 does not include a ground connection lead 218 between the input leads 214 or between the output leads 216, and thus, a distance between the input leads 214 and between the output leads 216 of the respective amplifier paths P1 and P2 may be reduced.

Figure 12:
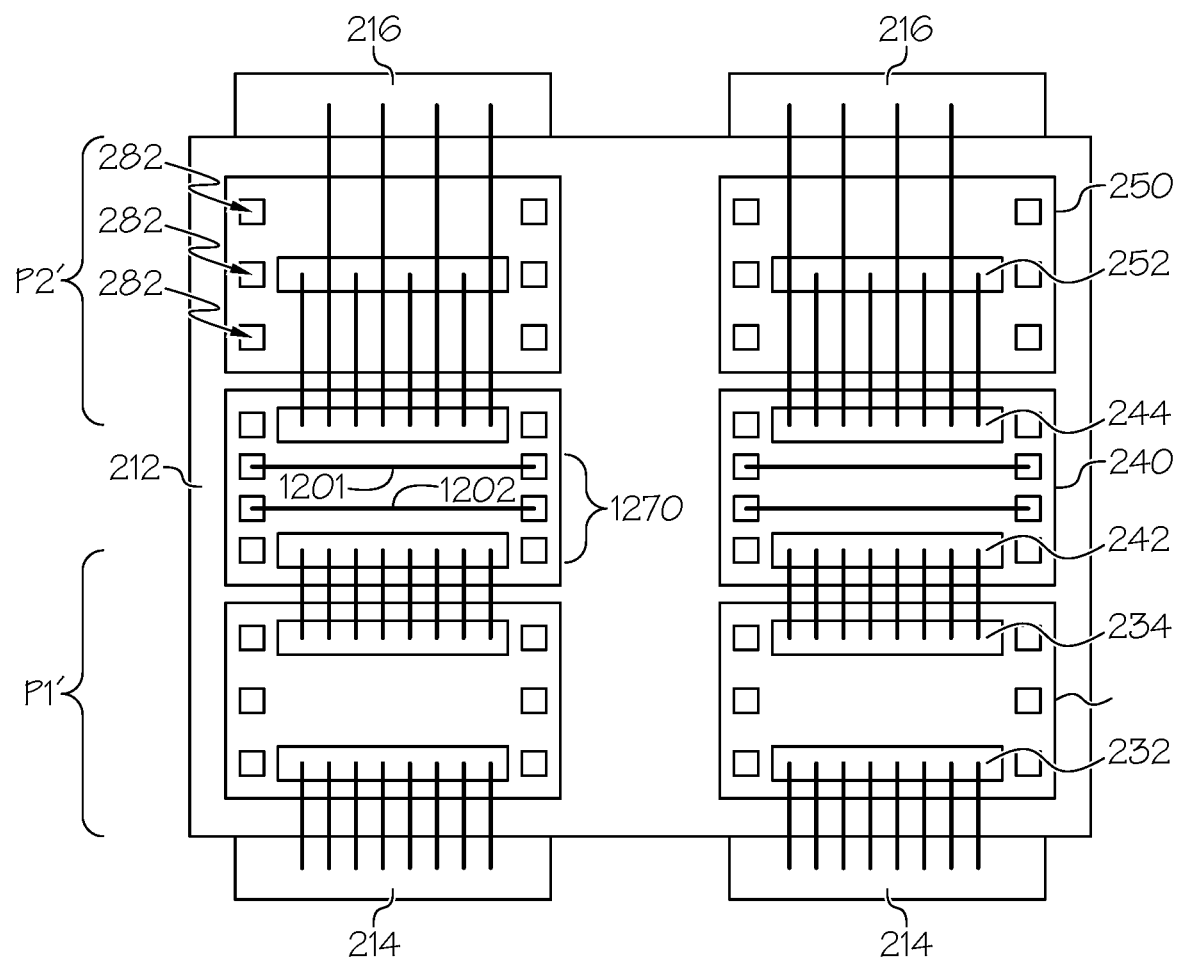
FIGS. 12, 13, and 14 are schematic plan views of RF transistor amplifier packages including wire bond-based isolation structures in linear and/or non-linear configurations coupled between input and output RF signal paths in accordance with various embodiments of the present disclosure.
Figure 13:
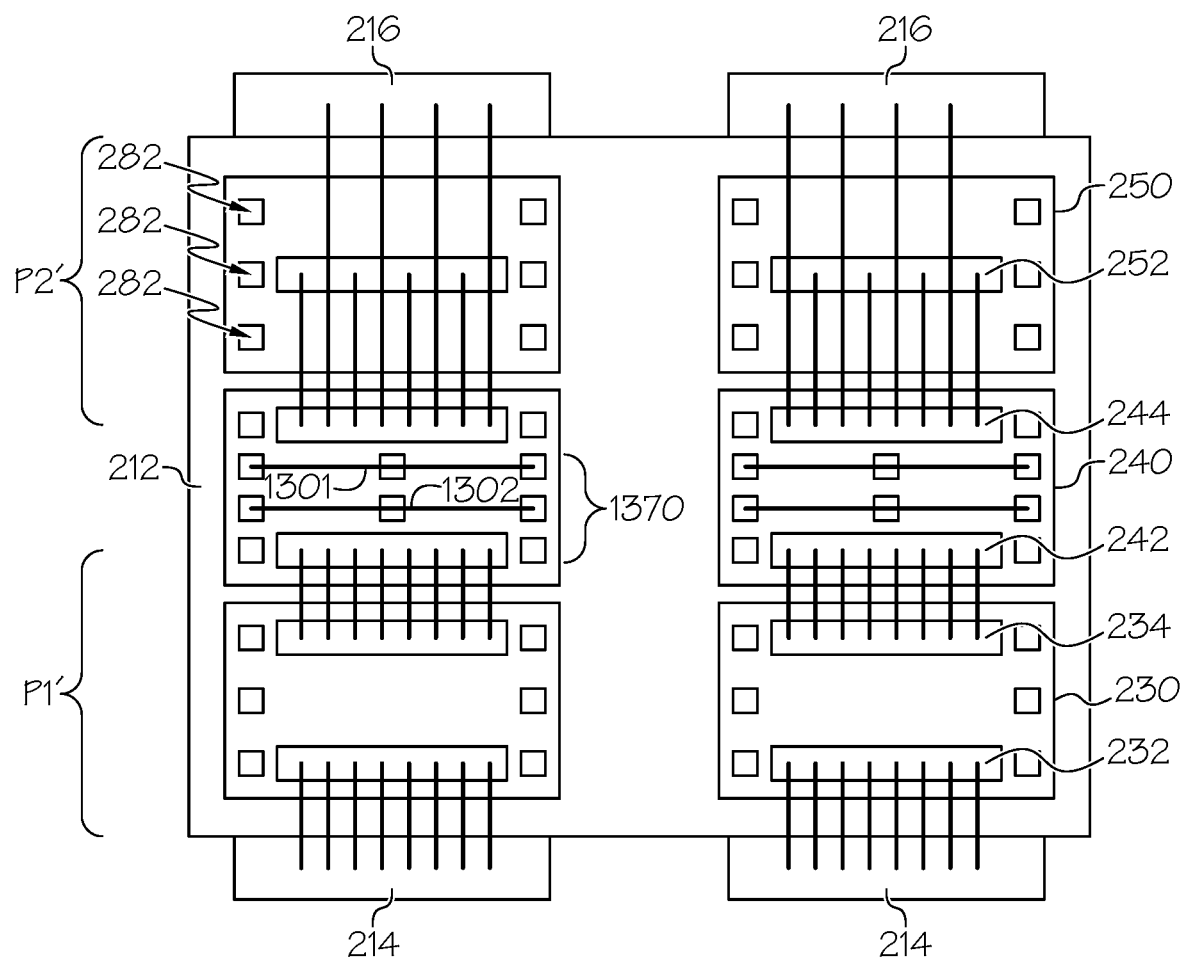
Figure 14:
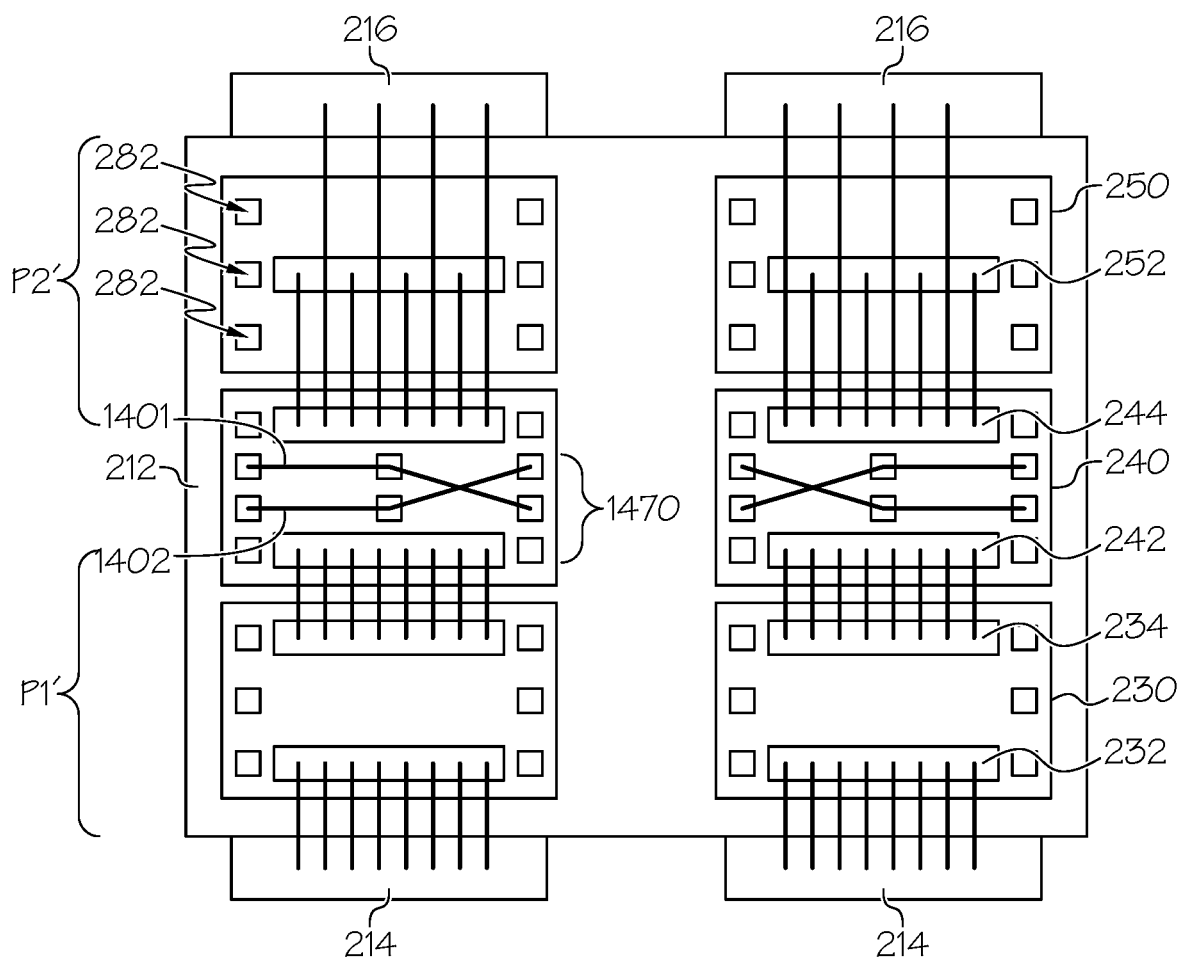

While described above with reference to isolation structures 275, 375, 475, 575, and 675 that extend between respective RF amplifier paths P1 and P2 to reduce EM coupling therebetween, it will be understood that wire bond-based isolation structures as described herein can similarly provide EM shielding between input and output RF signal paths of a single amplifier path (e.g., between respective inputs and outputs of one or both of the first and second amplifier paths P1 and P2). For example, FIGS. 7, 8, and 9 illustrate various embodiments of non-linear wire bond-based isolation structures that are provided between input and output RF signal paths P1' and P2' of the same RF amplifier path. FIGS. 12, 13, and 14 illustrate various embodiments of linear and/or non-linear wire bond-based isolation structures that are provided between input and output RF signal paths P1' and P2' of the same RF amplifier path.

In the examples of FIGS. 7, 8, and 9, the active transistor die 240 is coupled between input 214 and output 216 RF signal leads, and includes opposing sides (also referred to as edges) with bond pads 282 on a surface thereof and spaced apart from each other in the width direction of the package. For example, the active transistor die 240 may include first bond pads 282 adjacent to the first side of the active transistor die 240 and second bond pads 282 adjacent to the first side of the active transistor die 240. The first bond pads 282 may be spaced apart from each other in the direction of the first and second amplifier paths P1, P2, and the second bond pads 282 may be spaced apart from each other in the direction of the first and second amplifier paths P1, P2. The first and second bond pads 282 may be coupled to the electrical ground provided by the submount 212, e.g., by conductive vias 166 extending therethrough to electrically connect the bond pads 282 to a conductive attachment surface of the submount 212.

Referring to FIG. 7, an isolation structure includes first and second wire bonds 701 and 702 in a non-linear (e.g., crossed) configuration or structure 770 provided on a surface of the active transistor die 240, and coupled to multiple bond pads 282 of the active transistor die 240. For example, each of the first and second wire bonds 701 and 702 may be coupled to one of the first bond pads 282 and to one of the second bond pads 282 on the opposing sides of the die 240. In particular, each of the first and second wire bonds 701 and 702 extend from one of the first bond pads 282 adjacent to a first corner of the active transistor die 240 onto one of the second bond pads 282 adjacent to a second corner of the active transistor die 240, which is opposite the first corner of the active transistor die 240. One or more of the bond pads 282 may be coupled to the electrical ground grounded provided by the submount 212, e.g., by respective conductive vias 166 extending through the active die 240.

Referring to FIG. 8, an isolation structure includes first and second wire bonds 801 and 802 in a non-linear (e.g., crossed) configuration or structure 870 provided on a surface of the active transistor die 240, and coupled to multiple bond pads 282 of the active transistor die 240. In the example of FIG. 8, the active transistor die 240 may have one or more dimensions (e.g., a diagonal length) that are greater than a length (e.g., about 100 mils to 200 mils) of a single wire bond 801 or 802. The active transistor die 240 may include at least one bond pad 282 between the first and second bond pads 282 in the width direction of the package. The first and second wire bonds 801 and 802 extending between opposing corners of the active transistor die 240 may each include multiple segments, extending from a corner-positioned bond pad 282 to an internally (e.g., centrally)-positioned bond pad 282, and from the internally-positioned bond pad to the opposing corner-positioned bond pad 282, as depicted in FIG. 8. At least one of the bond pads 282 may be coupled to the electrical ground grounded provided by the submount 212, e.g., by respective conductive vias 166 extending through the active die 240.

Referring to FIG. 9, an isolation structure includes first and second wire bonds 901 and 902 in a non-linear (e.g., crossed) configuration or structure 970 provided on a surface of the active transistor die 240, and coupled to multiple bond pads 282 of the active transistor die 240. In the example of FIG. 9, the active transistor die 240 includes multiple internally-positioned bond pads 282, such that the wire bonds 901 and 902 extending from a corner-positioned bond pad 282 to an internally-positioned bond pad 282, and from the internally-positioned bond pad to the opposing corner-positioned bond pad 282, define multiple cross points. At least one of the bond pads 282 may be coupled to the electrical ground grounded provided by the submount 212, e.g., by respective conductive vias 166 extending through the active die 240.

In FIGS. 8 and 9 the wire bonds having multiple segments extending between respective bond pads 282 may be implemented as or may otherwise effectively provide continuously-extending wire bond-based isolation structures that cross each other multiple times. That is, each first wire bond 801, 901 and/or second wire bond 802, 902 may be implemented by multiple, serially-connected wire bonds. Such continuously extending wire bond-based isolation structures may be used between input and output RF signal paths of a same amplifier path as shown in FIGS. 7-9, as well as between the side-by-side RF amplifier paths as shown in FIGS. 2A-6, and in FIG. 10 described below.

Figure 10:
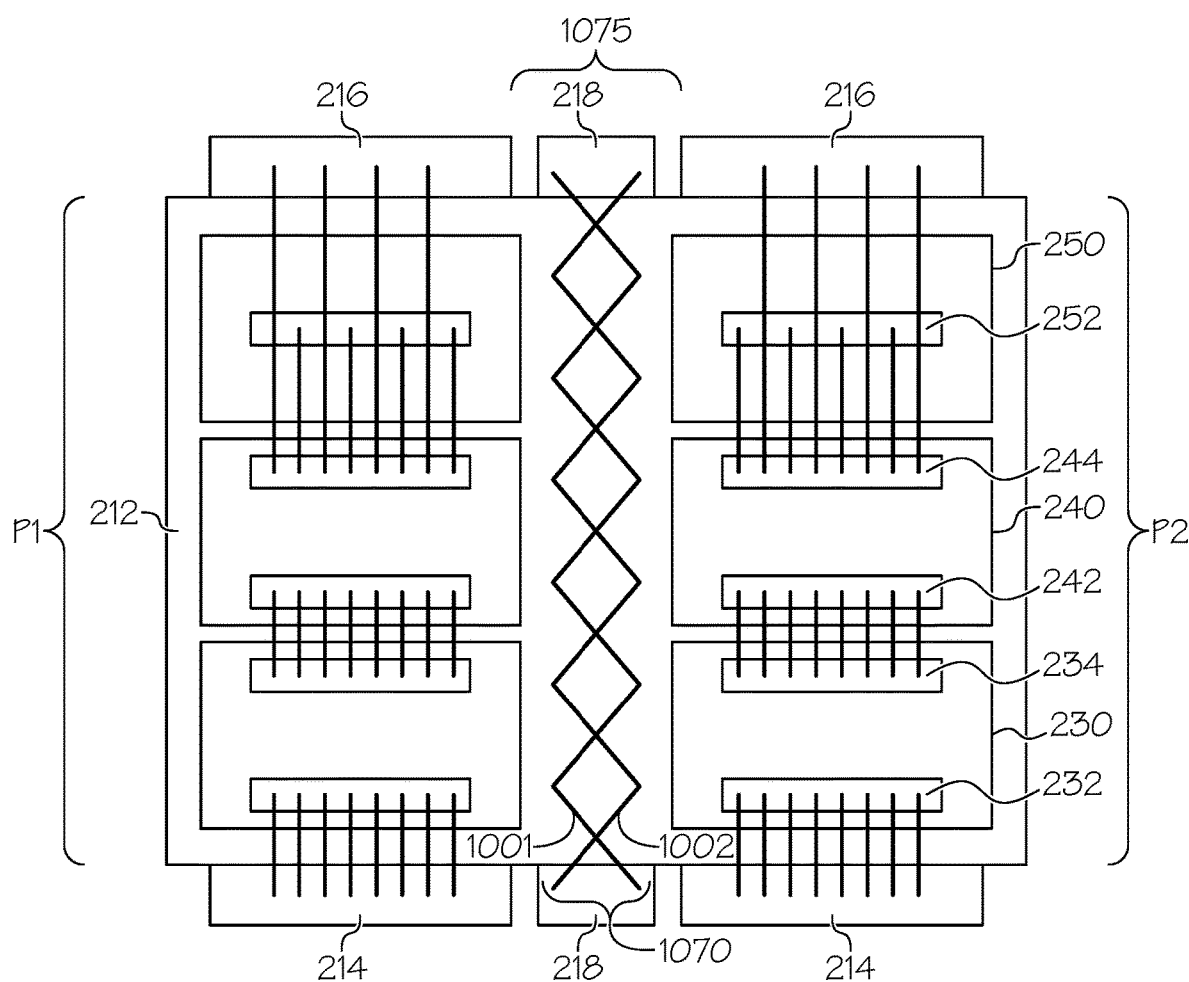
FIGS. 10 and 11 are schematic plan views of an RF transistor amplifier package including wire bond-based isolation structures in continuously extending configurations in accordance with various embodiments of the present disclosure.

FIG. 10 is a schematic plan view of a RF transistor amplifier package including wire bond-based isolation structures in non-linear configurations as implemented with continuously extending wire bonds in accordance with various embodiments of the present disclosure. The RF transistor amplifier package in FIG. 10 may be similar to the RF transistor amplifier package of FIGS. 2A and 2B, but includes an isolation structure 1075 where the first wire bond 1001 and the second wire bond 1002 define a continuously extending crossed configuration 1070 between the first and second amplifier paths P1 and P2. The crossed wire bond configuration 1070 defines multiple cross points between the first and second wire bonds 1001 and 1002.

In the example of FIG. 10, the first and second wire bonds 1001 and 1002 extend from the ground connection lead 218 between the first and second input leads 214 to the ground connection lead 218 between the first and second output leads 216 to define the multiple cross points; however, it will be understood that the ground leads 218 may be omitted in some embodiments (e.g., where the submount 212 includes one or more conductive surfaces or layers that provide the electrical ground). Each connection to the submount 212 and/or the ground connection lead 218 of the continuously extending crossed configuration 1070 defined by the first and/or second wire bonds 1001 and/or 1002 may include a respective wire bond segment. That is, the first wire bond 1001 and/or the second wire bond 1002 may each be implemented by multiple, serially-connected wire bonds to define the continuously extending crossed configuration 1070.

Figure 11:
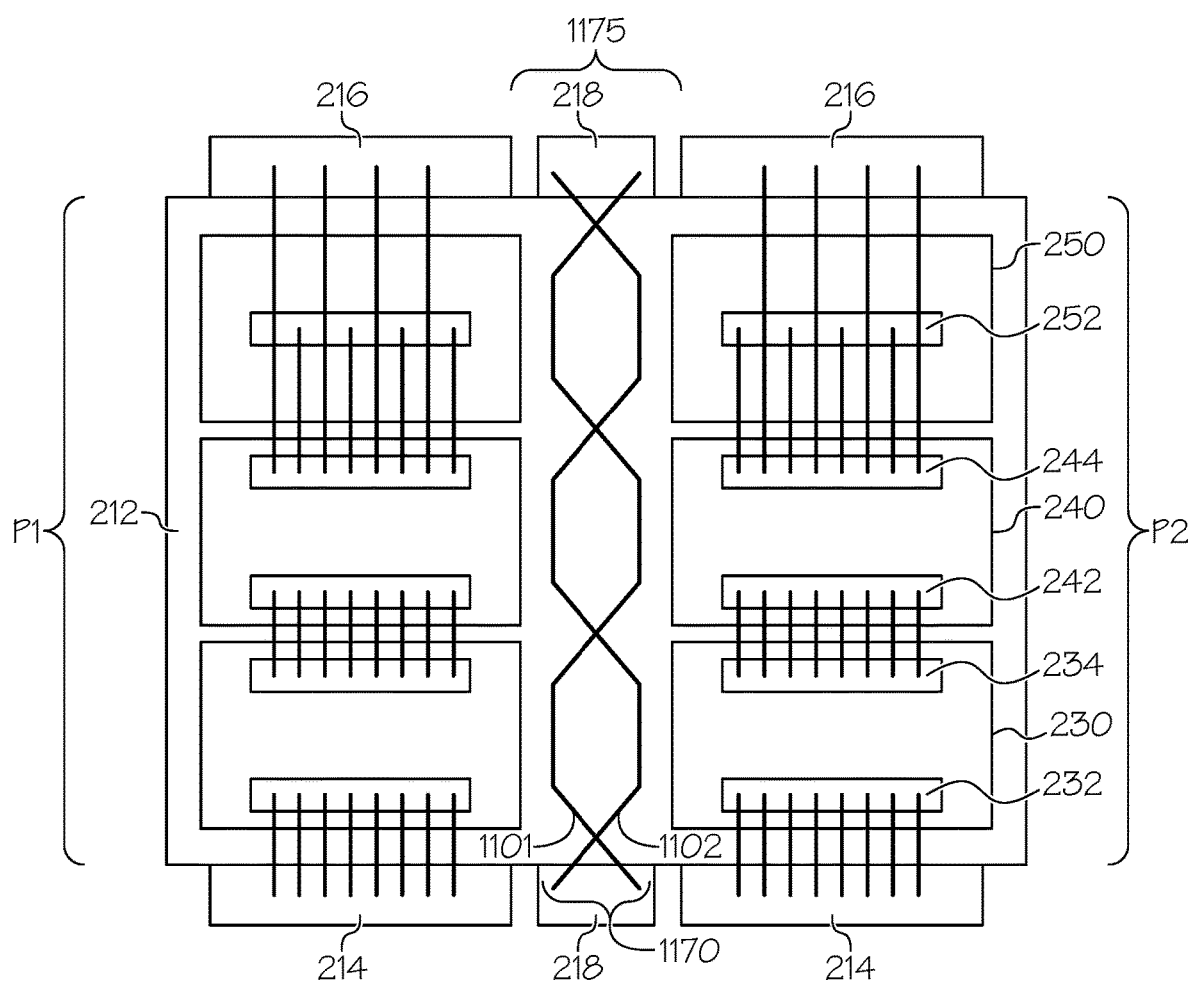

FIG. 11 is a schematic plan view of a RF transistor amplifier package including wire bond-based isolation structures in linear and non-linear configurations as implemented with continuously extending wire bonds in accordance with various embodiments of the present disclosure. The RF transistor amplifier package in FIG. 11 may be similar to the RF transistor amplifier package of FIG. 10, but includes an isolation structure 1175 where the first wire bond 1101 and the second wire bond 1102 define a continuously extending configuration 1170 including both linear (e.g., parallel wire bond) and non-linear (e.g., crossed wire bond) segments between the first and second amplifier paths P1 and P2. The continuously extending configuration 1170 defines multiple cross points between the first and second wire bonds 1101 and 1102, which in the example of FIG. 11 are provided in an alternating arrangement with linearly extending portions of the wire bonds 1101 and 1102. As similarly discussed with reference to FIG. 10, the ground leads 218 may be omitted in some embodiments. Also, the first wire bond 1101 and/or the second wire bond 1102 may each be implemented by multiple, serially-connected wire bonds to define the continuously extending configuration 1170 in some embodiments.

FIGS. 12, 13, and 14 are schematic plan views of RF transistor amplifier packages including wire bond-based isolation structures in linear and/or non-linear configurations coupled between input and output RF signal paths P1' and P2' in accordance with various embodiments of the present disclosure. In the embodiments of FIGS. 12 to 14, one or more of the bond pads 282 may be coupled to the electrical ground grounded provided by the submount 212, e.g., by respective conductive vias 166 extending through the active die 240.

Referring to FIG. 12, an isolation structure includes first and second wire bonds 1201 and 1202 extending in a linear configuration or structure 1270 on a surface of the active transistor die 240, and coupled to multiple bond pads 282 of the active transistor die 240 between the input and output RF signal paths P1' and P2'. For example, each of the first and second wire bonds 1201 and 1202 may be coupled to and may linearly extend between one of the first bond pads 282 and one of the second bond pads 282 on the opposing sides or edges of the die 240.

Referring to FIG. 13, an isolation structure includes first and second wire bonds 1301 and 1302 extending in a linear configuration or structure 1370 on a surface of the active transistor die 240, and coupled to multiple bond pads 282 of the active transistor die 240 between the input and output RF signal paths P1' and P2'. In the example of FIG. 13, the first and second wire bonds 1301 and 1302 extending between opposing edges of the active transistor die 240 may each include multiple segments, linearly extending from an edge-positioned bond pad 282 to an internally (e.g., centrally)-positioned bond pad 282, and from the internally-positioned bond pad 282 to the opposing edge-positioned bond pad 282.

Referring to FIG. 14, an isolation structure includes first and second wire bonds 1401 and 1402 extending in a linear and crossed configuration or structure 1470 on a surface of the active transistor die 240, and coupled to multiple bond pads 282 of the active transistor die 240 between the input and output RF signal paths P1' and P2'. The first and second wire bonds 1401 and 1402 extending between opposing edges of the active transistor die 240 may each include multiple segments, which extend linearly from an edge-positioned bond pad 282 to an internally-positioned bond pad 282, and extend in a crossed configuration from the internally-positioned bond pad 282 to the opposing edge-positioned bond pad 282.

Figure 15:
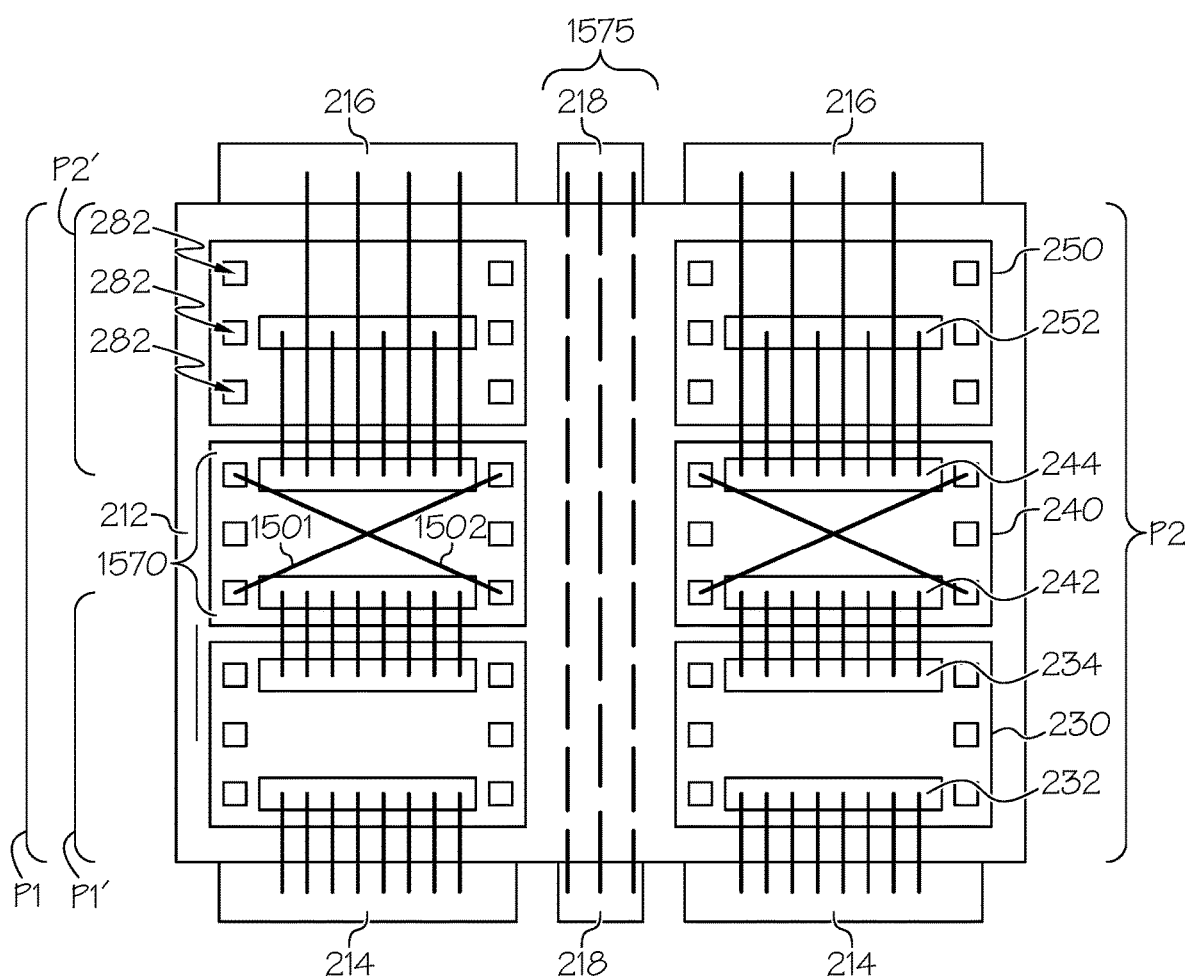
FIGS. 15 and 16 are schematic plan views of RF transistor amplifier packages including combinations of wire bond-based isolation structures in linear and/or non-linear configurations in accordance with various embodiments of the present disclosure.
Figure 16:
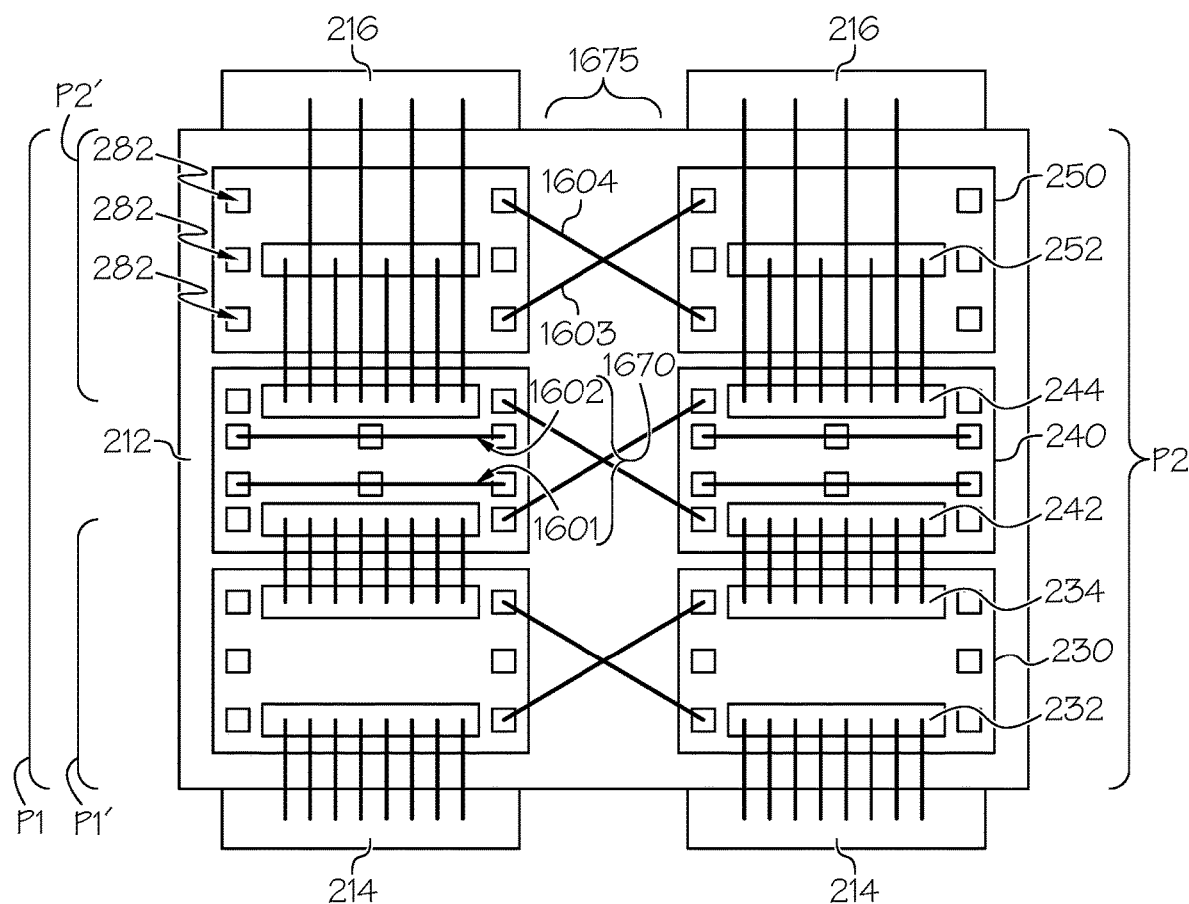

FIGS. 15 and 16 are schematic plan views of RF transistor amplifier packages including combinations of wire bond-based isolation structures in linear and/or non-linear configurations in accordance with various embodiments of the present disclosure. The embodiments of FIGS. 15 and 16 illustrate particular combinations of wire bond-based isolation structures between adjacent RF amplifier paths and between input and output RF signal paths of each RF amplifier path by way of example only, and it will be understood that any of the wire bond-based isolation structures between adjacent RF amplifier paths (e.g., isolation structures 275, 375, 475, 575, 675, 1075, 1175) may be combined with any of the wire bond-based isolation structures between input and output RF signal paths (e.g., 770, 870, 970, 1270, 1370, 1470) described herein.

Referring to FIG. 15, an isolation structure 1570 is provided between input and output RF signal paths P1' and P2'. The isolation structure 1570 includes first and second wire bonds 1501 and 1502 in a non-linear (e.g., crossed) configuration on a surface of the active transistor die 240. The first and second wire bonds 1501 and 1502 are coupled to multiple bond pads 282, one or more of which may be coupled to the electrical ground grounded provided by the submount 212, e.g., by respective conductive vias 166 extending through the active die 240. In addition, an isolation structure 1575 is provided between adjacent RF amplifier paths P1 and P2. In the example of FIG. 15, the isolation structure 1575 includes wire bonds extending in a linear configuration between the amplifier paths P1 and P2; however, the isolation structure 1575 may further include wire bonds in a non-linear (e.g., crossed) configuration in accordance with any of the embodiments described herein. Likewise, while the wire bonds of the isolation structure 1575 extend from the ground connection lead 218 between the first and second input leads 214 to the ground connection lead 218 between the first and second output leads 216, it will be understood that the ground leads 218 may be omitted in some embodiments (e.g., where the submount 212 includes one or more conductive surfaces or layers that provide the electrical ground).

Referring to FIG. 16, as another example, an isolation structure 1670 is provided on the active transistor die 240 between input and output RF signal paths P1' and P2'. The isolation structure 1670 includes first and second wire bonds 1601 and 1602 in a linear configuration coupled to multiple bond pads 282, one or more of which may be coupled to the electrical ground grounded provided by the submount 212. In addition, an isolation structure 1675 is provided between adjacent RF amplifier paths P1 and P2 and includes wire bonds 1603 and 1604 extending in a non-linear (e.g., crossed) configuration. In the example of FIG. 16, each of the wire bonds 1603 and 1604 is coupled to a respective bond pad 282 of one of the active transistor die 240, the passive die 230 defining a portion of the input matching circuit, or the passive die 250 defining a portion of the output matching circuit of each amplifier path P1 and P2, but it will be understood that one or more of the wire bonds 1603 and 1604 of each crossed structure may be directly coupled to the submount 212 in some embodiments (e.g., where the submount 212 includes one or more conductive surfaces or layers that provide the electrical ground). Also, the isolation structure 1675 may further include wire bonds in a linear configuration in some embodiments.

Wire bond-based isolation structures including linear and/or non-linear (e.g., crossed) wire bond configurations in accordance with embodiments of the present disclosure may be used in any RF transistor package including multiple (e.g., serial or parallel) RF signal paths, such as but not limited to a dual-path Class AB driver amplifiers and/or Doherty amplifier configurations. RF transistor packages according to embodiments of the present disclosure may include air cavity and over molded plastic packages. Embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications. Embodiments of the present disclosure may also be applied to radar and monolithic microwave integrated circuit (MMIC)-type applications. More generally, embodiments of the present disclosure may be used in any RF power package in which isolation between two or more RF signal paths may be desired.

Referring again to FIG. 1E, a semiconductor structure 130 that may be used in RF transistor amplifier packages described herein, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate 322 may be a High Purity Semi-Insulating (HPSI) substrate, available from Cree, Inc. The term "semi-insulating" is used descriptively herein, rather than in an absolute sense.

As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

In some embodiments of the present invention, the SiC bulk crystal of the substrate 322 may have a resistivity equal to or higher than about 1×105 ohm-cm at room temperature. Exemplary SiC substrates that may be used in some embodiments of the present invention are manufactured by, for example, Cree, Inc., of Durham, N.C., the assignee of the present invention. Methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although SiC can be used as a substrate material, embodiments of the present application may utilize any suitable substrate. The substrate 322 can be an SiC wafer, and the HEMT device can be formed, at least in part, via wafer-level processing, and the wafer can then be diced to provide a plurality of individual HEMTs.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0 \leq x < 1$, provided that the energy of the conduction band edge of the channel layer 324 is less than the energy of the conduction band edge of the barrier layer 326 at the interface between the channel and barrier layers 324, 326. In certain embodiments of the present invention, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 μm. The channel layer 324 may also be a multi-layer structure, such as a superlattice or combinations of GaN, AlGaN or the like. The channel layer 324 may be under compressive strain in some embodiments.

As discussed above with respect to HEMT devices, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 156 and the drain contact 154, respectively. The channel layer 324 and the barrier layer 326 form the semiconductor structure 130.

While semiconductor structure 130 is shown with channel layer 324 and barrier layer 326 for purposes of illustration, semiconductor structure 130 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface of the substrate 322 to provide an appropriate crystal structure transition between the silicon carbide substrate 322 and the remainder of the HEMT device. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 156 and a drain contact 154 may be formed on an upper surface of the barrier layer 326 and may be laterally spaced apart from each other. A gate contact 152 may be formed on the upper surface of the barrier layer 326 between the source contact 156 and the drain contact 154. The material of the gate contact 152 may be chosen based on the composition of the barrier layer 326, and may, in some embodiments, be a Schottky contact.

The source contact 156 may be coupled to a reference signal such as, for example, a ground voltage. The coupling to the reference signal may be provided by a via 166 that extends from a lower surface of the substrate 322, through the substrate 322 to an upper surface of the barrier layer 326. The via 166 may expose a bottom surface of the ohmic portion of the source contact 156. A backmetal layer 126 may be formed on the lower surface of the substrate 322 and on sidewalls of the via 166. The backmetal layer 126 may directly contact the ohmic portion of the source contact 156. Thus, the backmetal layer 126, and a signal coupled thereto, may be electrically connected to the source contact 156.

Still referring to FIG. 1E, the HEMT device may include a first insulating layer 350 and a second insulating layer 355. The first insulating layer 350 may directly contact the upper surface of the semiconductor structure 130 (e.g., contact the upper surface of the barrier layer 326). The second insulating layer 355 may be formed on the first insulating layer 350. It will also be appreciated that more than two insulating layers may be included in some embodiments. The first insulating layer 350 and the second insulating layer 355 may serve as passivation layers for the HEMT device.

The source contact 156, the drain contact 154, and the gate contact 152 may be formed in the first insulating layer 350. In some embodiments, at least a portion of the gate contact 152 may be on the first insulating layer. In some embodiments, the gate contact 152 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 154, gate contact 152, and source contact 156.

In some embodiments, field plates 360 may be formed on the second insulating layer 355. At least a portion of a field plate 360 may be on the gate contact 152. At least a portion of the field plate 360 may be on a portion of the second insulating layer 355 that is between the gate contact 152 and the drain contact 154. Field plates and techniques for forming field plates are discussed, by way of example, in U.S. Pat. No. 8,120,064, the disclosure of which is hereby incorporated herein in its entirety by reference.

Metal contacts 365 may be disposed in the second insulating layer 355. The metal contacts 365 may provide interconnection between the drain contact 154, gate contact 152, and source contact 156 and other parts of the HEMT device. Respective ones of the metal contacts 365 may directly contact respective ones of the drain contact 154 and/or source contact 156. The metal contacts 365 may contain metal or other highly conductive material, including, for example, copper, cobalt, gold, and/or a composite metal.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor amplifier package, comprising:
a base;
one or more transistor dies on the base;
first and second leads coupled to the one or more transistor dies, wherein the first and second leads define respective radio frequency (RF) signal paths; and
an isolation structure between the respective RF signal paths, the isolation structure comprising first and second wire bonds in a crossed configuration defining at least one cross point therebetween.

2. The transistor amplifier package of claim 1, wherein the base comprises a conductive element that is configured to provide an electrical ground for the one or more transistor dies, and wherein the first and second wire bonds are coupled to the conductive element and/or to respective bond pads that are electrically connected to the conductive element.

3. The transistor amplifier package of claim 2, wherein the isolation structure comprises a plurality of crossed wire bond structures arranged in one or more dimensions between the respective RF signal paths, wherein a respective one of the crossed wire bond structures comprises the first and second wire bonds in the crossed configuration.

4. The transistor amplifier package of claim 3, wherein at least one of the first and second wire bonds comprises a plurality of wire bonds, such that the first and/or second wire bonds cross two or more of the plurality of wire bonds.

5. The transistor amplifier package of claim 2, wherein the respective bond pads include bond pads on a surface of the one or more transistor dies and/or bond pads on a surface of one or more passive devices on the base.

6. The transistor amplifier package of claim 2, wherein the isolation structure continuously extends between the respective RF signal paths, and wherein the first and second wire bonds define multiple cross points therebetween.

7. The transistor amplifier package of claim 2, wherein the respective RF signal paths comprise first and second RF amplifier paths, wherein the first and second leads comprise first and second input leads or first and second output leads of the first and second RF amplifier paths, respectively, and wherein the one or more transistor dies comprises first and second transistor dies coupled to the first and second leads, respectively.

8. The transistor amplifier package of claim 7, wherein the first and second wire bonds are coupled to the respective bond pads, wherein the respective bond pads include bond pads that are on the first and second transistor dies of the first and second RF amplifier paths and/or bond pads that are on respective passive devices coupled to the first and second transistor dies.

9. The transistor amplifier package of claim 7, wherein the conductive element comprises a ground connection lead between the first and second input leads or between the first and second output leads.

10. The transistor amplifier package of claim 7, wherein the conductive element comprises a surface of the base including the one or more transistor dies thereon, and wherein the base is free of a ground connection lead.

11. The transistor amplifier package of claim 7, wherein the isolation structure comprises a first isolation structure between the first and second RF amplifier paths, and further comprising:
a second isolation structure on at least one of the first and second transistor dies between input and output RF signal paths of a corresponding one of the first and second RF amplifier paths, the second isolation structure comprising respective wire bonds in a linear or crossed configuration.

12. The transistor amplifier package of claim 2, wherein the respective RF signal paths comprise input and output RF signal paths of a RF amplifier path, wherein the first and second leads comprise input and output leads of the RF amplifier path, respectively, and wherein the one or more transistor dies comprises a first transistor die coupled between the input and output leads.

13. The transistor amplifier package of claim 12, wherein the respective bond pads are on a surface of the first transistor die, and wherein each of the first and second wire bonds is coupled to multiple of the respective bond pads.

14. The transistor amplifier package of claim 1, wherein the first and second wire bonds are separated from one another by less than 5 mils.

15. The transistor amplifier package of claim 14, wherein, at a cross point between the first and second wire bonds, the first and second wire bonds are separated from one another by about 2 mils or less.

16. The transistor amplifier package of claim 15, wherein respective loop heights of the first and second wire bonds from the base are at least a height of the one or more transistor dies from the base.

17. The transistor amplifier package of claim 1, wherein respective loop heights of the first and second wire bonds from the base are different.

18. The transistor amplifier package of claim 1, wherein the one or more transistor dies comprise a gallium nitride-based high electron mobility transistor (HEMT).

19. The transistor amplifier package of claim 1, wherein the one or more transistor dies comprise a silicon-based laterally diffused metal oxide semiconductor (LDMOS) transistor.

20. The transistor amplifier package of claim 1, wherein the one or more transistor dies are configured to operate in at least a portion of one or more of 0.6-1 GHz, 1.4-1.6 GHz, 1.7-1.9 GHz, 1.8-2.2 GHz, 2.3-2.7 GHz, 3.3-4.2 GHz, 4.4-5.0 GHz, or 5.1-6.0 GHz frequency bands.

21. The transistor amplifier package of claim 1, wherein the one or more transistor dies are configured to operate at frequencies above 10 GHz.

22. The transistor amplifier package of claim 1, further comprising:
a housing comprising a ceramic lid that defines an air cavity around the one or more transistor dies.

23. The transistor amplifier package of claim 1, further comprising:
a housing comprising a plastic overmold that encapsulates the one or more transistor dies.

24. A transistor amplifier package, comprising:
a base;
one or more transistor dies on the base;
first and second leads coupled to the one or more transistor dies, wherein the first and second leads define respective radio frequency (RF) signal paths; and
an isolation structure between the respective RF signal paths, the isolation structure comprising first and second wire bonds that are separated from one another by less than about 5 mils.

25. A transistor amplifier package, comprising:
a base;
one or more transistor dies on the base;
first and second leads coupled to the one or more transistor dies, wherein the first and second leads define respective radio frequency (RF) signal paths; and
an isolation structure between the respective RF signal paths, the isolation structure comprising first and second wire bonds in a non-linear configuration coupled to the base and/or to the one or more transistor dies.

26. A transistor amplifier package, comprising:
a base;
a transistor die on the base;
input and output leads coupled to the transistor die, wherein the input and output leads define input and output radio frequency (RF) signal paths, respectively, of a RF amplifier path; and
an isolation structure between the input and output RF signal paths, the isolation structure comprising first and second wire bonds coupled to the base and/or to respective bond pads of the transistor die.

27. The transistor amplifier package of claim 24, wherein the first and second wire bonds have a crossed configuration defining at least one cross point therebetween.

28. The transistor amplifier package of claim 27, wherein, at the at least one cross point, the first and second wire bonds are separated from one another by about 2 mils or less.

29. The transistor amplifier package of claim 24, wherein the isolation structure continuously extends between the respective RF signal paths, and the first and second wire bonds define multiple cross points therebetween.

30. The transistor amplifier package of claim 25, wherein the base comprises a conductive layer that is configured to provide an electrical ground, and wherein the first and second wire bonds are coupled to respective bond pads of the one or more transistor dies that are electrically connected to the conductive layer.

31. The transistor amplifier package of claim 30, wherein the first and second wire bonds have a crossed configuration defining at least one cross point therebetween.

32. The transistor amplifier package of claim 31, wherein each of the first and second wire bonds is coupled between the conductive layer of the base and a respective one of the bond pads of the first or second transistor dies.

33. The transistor amplifier package of claim 31, wherein each of the first and second wire bonds is coupled between a respective one of the bond pads of the first transistor die and a respective one of the bond pads of the second transistor die.

34. The transistor amplifier package of claim 26, wherein the base comprises a conductive layer that is configured to provide an electrical ground, and wherein the respective bond pads of the transistor die are electrically connected to the conductive layer.

35. The transistor amplifier package of claim 34, wherein the first and second wire bonds extend parallel to one another in a linear configuration between the input and output RF signal paths.

36. The transistor amplifier package of claim 34, wherein the first and second wire bonds have a crossed configuration defining at least one cross point between the input and output RF signal paths.

* * * * *